United States Patent
Elaasar

(10) Patent No.: US 12,362,703 B2
(45) Date of Patent: Jul. 15, 2025

(54) INDUCTOR-CAPACITOR VOLTAGE-CONTROLLED OSCILLATOR WITH COMMON-MODE NOISE SUPPRESSION

(71) Applicant: Apple Inc., Cupertino, CA (US)

(72) Inventor: Omar E Elaasar, San Diego, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/478,211

(22) Filed: Sep. 29, 2023

(65) Prior Publication Data

US 2025/0112593 A1    Apr. 3, 2025

(51) Int. Cl.
 *H03B 5/12*    (2006.01)
(52) U.S. Cl.
 CPC ......... *H03B 5/1253* (2013.01); *H03B 5/1215* (2013.01); *H03B 5/1228* (2013.01); *H03B 5/1265* (2013.01)
(58) Field of Classification Search
 CPC .. H03B 5/1253; H03B 5/1215; H03B 5/1228; H03B 5/1265
 See application file for complete search history.

(56) References Cited

U.S. PATENT DOCUMENTS

| | | | |
|---|---|---|---|
| 7,961,056 B2 | 6/2011 | Taylor et al. | |
| 8,058,938 B2 | 11/2011 | Aga et al. | |
| 8,102,216 B1 | 1/2012 | Kaczynski | |
| 9,214,895 B2 | 12/2015 | Shanan | |
| 11,165,389 B1 | 11/2021 | Komijani et al. | |
| 11,218,113 B1 | 1/2022 | Bhat et al. | |
| 11,621,670 B1 | 4/2023 | Spataro et al. | |
| 2004/0150485 A1 | 8/2004 | Muramatsu | |
| 2013/0309983 A1 | 11/2013 | Ashckenazi et al. | |
| 2014/0292419 A1* | 10/2014 | Ragonese | H03B 1/02 331/46 |
| 2020/0295765 A1 | 9/2020 | Agrawal et al. | |

* cited by examiner

*Primary Examiner* — Jeffrey M Shin
(74) *Attorney, Agent, or Firm* — FLETCHER YODER PC

(57) ABSTRACT

This disclosure is directed to a Voltage-Controlled Oscillator (VCO) with reduced phase noise compared to other VCOs. The VCO may include a first cell and a second cell separated by common-mode (CM) isolation circuitry. The first cell and the second cell may each include a portion of the CM noise of the VCO. Moreover, gate terminals of switches of the first cell and the second cell may be cross-coupled to drain terminals of the switches of the second cell and the first cell respectively. An interdependency of voltages of the first cell and the second cell may reduce an amplitude of the respective portions of the CM noise on the first cell and the second cell.

20 Claims, 7 Drawing Sheets

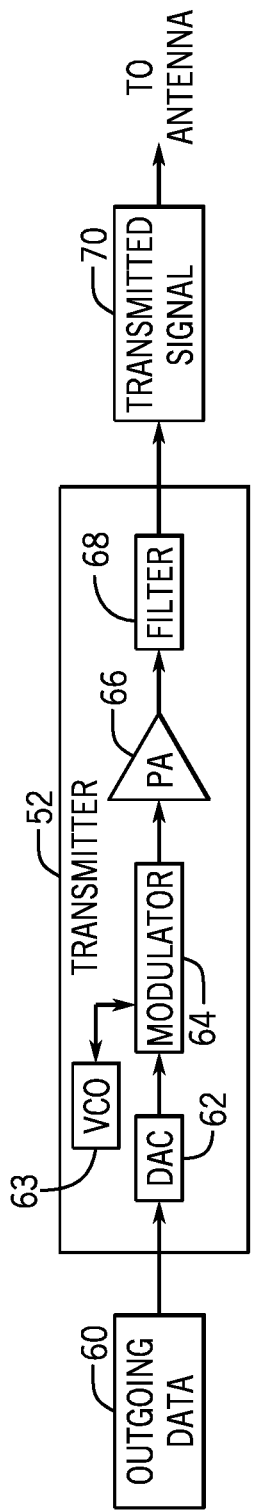
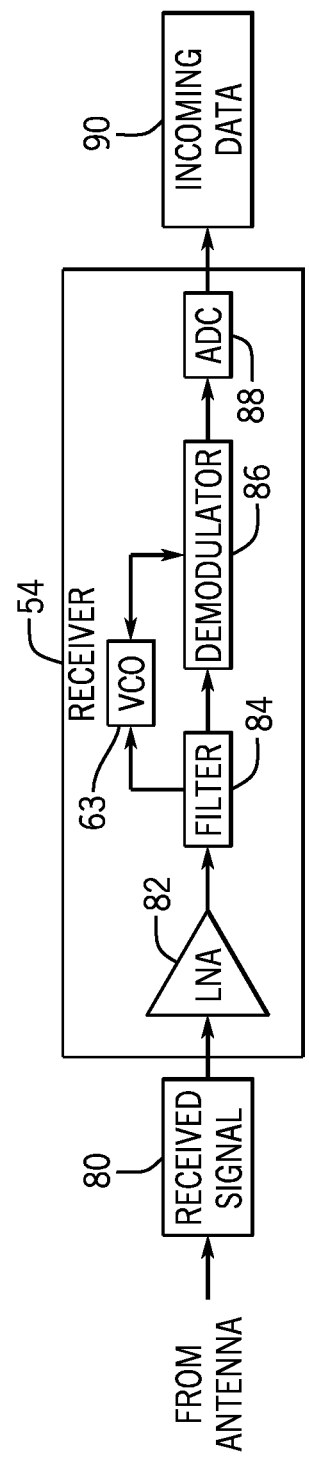

INDUCTOR-CAPACITOR VOLTAGE-CONTROLLED OSCILLATOR WITH COMMON-MODE NOISE SUPPRESSION

BACKGROUND

The present disclosure relates generally to wireless communication, and more specifically to voltage-controlled oscillators of transmitter and/or receiver circuits.

In some applications, a voltage-controlled oscillator (VCO) may include current-source circuitry and resonator circuitry. The current-source circuitry may generate a direct current (DC) signal based on receiving a bias voltage. The resonator circuitry may generate a VCO output signal based on the DC signal. For example, the resonator circuitry may generate the output signal with a desired oscillation frequency and voltage amplitude based on an inductive and/or capacitive value of components of the resonator circuitry and an electrical current value of the DC signal. In some cases, the current-source circuitry and/or the resonator circuitry may include one or more non-linear capacitors among other components. A change in a voltage value across a non-linear capacitor may correspond to a change in the capacitance value of the non-linear capacitor. The changes in the capacitance value of the non-linear capacitors may generate undesired noise on a phase and/or frequency of the output signal.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, an electronic device may include an antenna and a voltage-controlled oscillator (VCO) coupled to the antenna. The VCO may include a first switch, a second switch, a first inductor-capacitor tank circuit coupled to the first switch and the second switch, a second inductor-capacitor tank circuit coupled to the first inductor-capacitor tank circuit, a third switch coupled to the second inductor-capacitor tank circuit, a third gate terminal of the third switch being coupled to the second switch, and a fourth switch coupled to the second inductor-capacitor tank circuit, a fourth gate terminal of the fourth switch being coupled to the first switch.

In another embodiment, a transceiver may include amplification circuitry and voltage-controlled oscillator (VCO) coupled to the amplification circuitry. The VCO may include a first switch that may output a first voltage, a second switch that may output a second voltage, a third switch that may output a third voltage, a fourth switch that may output a fourth voltage, a first inductor-capacitor tank circuit coupled to the first switch and the second switch, and a second inductor-capacitor tank circuit coupled to third switch, the fourth switch, and the first inductor-capacitor tank circuit, the second inductor-capacitor tank circuit may inductively couple to the first inductor-capacitor tank circuit based on the first switch receiving the fourth voltage, the second switch receiving the third voltage, the third switch receiving the second voltage, and the fourth switch receiving the first voltage.

In yet another embodiment, a voltage-controlled oscillator (VCO) may include a first switch, a second switch, a first inductor-capacitor tank circuit coupled to the first switch and the second switch, a second inductor-capacitor tank circuit coupled to the first inductor-capacitor tank circuit, a third switch coupled to the second inductor-capacitor tank circuit, a third gate terminal of the third switch being coupled to the second switch, a second gate terminal of the second switch being coupled to the third switch, and a fourth switch coupled to the second inductor-capacitor tank circuit, a fourth gate terminal of the fourth switch being coupled to the first switch, a first gate terminal of the first switch being coupled to the fourth switch.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

FIG. 3 is a schematic diagram of a transmitter of the electronic device of FIG. 1, according to embodiments of the present disclosure;

FIG. 4 is a schematic diagram of a receiver of the electronic device of FIG. 1, according to embodiments of the present disclosure;

DETAILED DESCRIPTION OF SPECIFIC EMBODIMENTS

Figure 1:
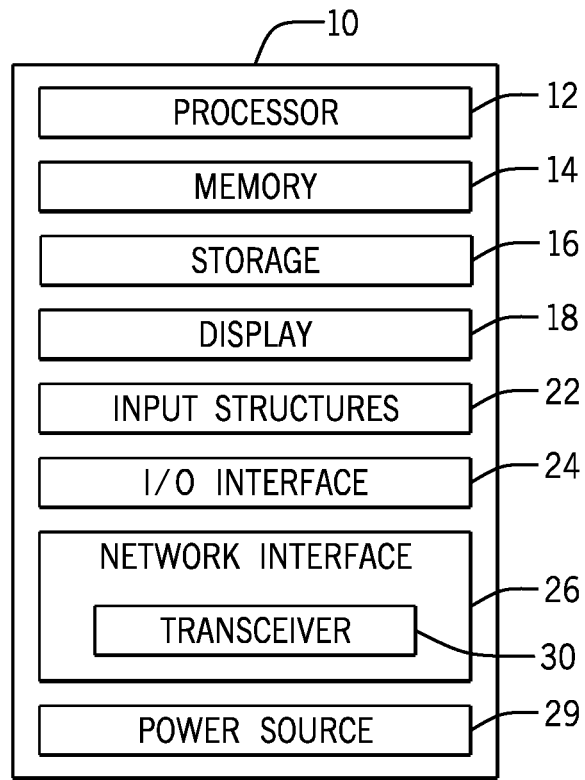
FIG. 1 is a block diagram of an electronic device, according to embodiments of the present disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on. Additionally, the term "set" may include one or more. That is, a set may include a unitary set of one member, but the set may also include a set of multiple members.

This disclosure is directed to an inductor-capacitor (LC) voltage-controlled oscillator (VCO), hereinafter referred to as a VCO, with reduced phase noise compared to other VCOs that do not include the disclosed embodiments. The VCO may generate an output signal (e.g., a differential output signal) with a desired oscillation frequency during operation. The VCO may include differential circuitry for generating the output signal. If not compensated for, in some cases, the VCO may also generate undesired common-mode (CM) noise during operation. The CM noise may cause undesired voltage and/or frequency offsets around the output signal causing undesired flicker and/or phase noise of the output signal. The VCO may include circuitry to reduce an amplitude of the undesired CM noises, as will be appreciated.

In some cases, one or more non-linear capacitors of the VCO may generate the CM noise. For example, voltage fluctuations across terminals of a non-linear capacitor may generate at least a portion of the CM noise. In different cases, the voltage fluctuations may be caused by thermally-induced noises, power supply voltage fluctuations, a gate-induced induced noise of one or more switches of the VCO, a noise of one or more VCO materials and/or components, a noise due to manufacturing processes and/or manufacturing process variations, a flicker noise of one or more complementary metal-oxide-semiconductor (CMOS) components of the VCO, or a combination thereof, among other things.

The VCO may include a first cell and a second cell. The first cell may include a first portion of (e.g., half of, near half of) non-linear capacitors of the VCO and the second cell may include a remaining portion of (e.g., half of, near half of) the non-linear capacitors. As such, the first cell may generate a portion of (e.g., half of, near half of) the CM noise and the second cell may generate a remaining portion of (e.g., half of, near half of) the CM noise.

The first cell may be coupled to the second cell via common-mode isolation circuitry to provide common-mode isolation (e.g., common-mode uncoupling, common-mode separation) between the first cell and the second cell. For example, the common-mode isolation circuitry may include a transmission line, a transformer, and/or an impedance component having a resonant frequency based on the desired oscillation frequency of the output signal. The common-mode isolation circuitry may conduct direct current (DC) signals and the output signal while reducing an amplitude of a CM noise of the first cell at the second cell and reducing an amplitude of a CM noise of the second cell at the first cell.

As such, the first cell and the second cell may generate and/or conduct the output signal. Moreover, the first cell may generate a first portion of the CM noise (a first CM noise) uncoupled from a second portion (e.g., a remaining portion) of the CM noise (a second CM noise) of the second cell. Output terminals of the VCO may be disposed on the first cell or the second cell. The VCO may output the output signal with a respective portion of (e.g., half of, near half of) the CM noise of the first cell or the second cell via the output terminals. Accordingly, the VCO may reduce an amplitude of the undesired CM noises to improve phase noise of the output signal by common-mode isolation (e.g., common-mode uncoupling, common-mode separation) of the first cell and the second cell.

With the foregoing in mind, the first cell and the second cell may each include switches. In some cases, the switches of the first cell may conduct the first CM noise away from the common-mode isolation circuitry and the switches of the second cell may conduct the second CM noise away from the common-mode isolation circuitry. As such, the first CM noise of the first cell and the second CM noise of the second cell may have different (e.g., near opposite, opposite) amplitude and/or phase. Moreover, the first cell may include the output signal and the first CM noise and the second cell may include the output signal and the second CM noise. As mentioned above, the CM noise may cause the undesired voltage and/or the frequency offsets around the output signal. Accordingly, if not compensated for, the first cell and the second cell may each include the output signal with different (e.g., near opposite, opposite) perturbations.

A gate terminal of each switch of the first cell may be coupled to a drain terminal of a respective switch of the second cell. Moreover, a gate terminal of each switch of the second cell may be coupled to a drain terminal of a respective switch of the first cell. During operation of the VCO, the first cell and the second cell may both include the output signal while the first cell may include the first CM noise uncoupled from the second CM noise of the second cell. As mentioned above, the first CM noise of the first cell and the second CM noise of the second cell may have different (e.g., near opposite, opposite) amplitude and/or phase.

As such, the switches of the first cell may reduce the undesired voltage and/or the frequency offsets of the output signal caused by the first CM noise based on receiving the second CM noise. For example, the second CM noise may reduce an amplitude change and/or phase shift of the output signal by the first CM noise on the first cell. Moreover, the switches of the second cell may reduce the undesired voltage and/or the frequency offsets of the output signal caused by the second CM noise based on receiving the first CM noise. For example, the first CM noise may reduce an amplitude change and/or phase shift of the output signal by the second CM noise on the second cell. Accordingly, gate voltage interdependency of the switches of the first cell and the second cell may reduce the undesired voltage and/or the frequency offsets of the output signal based on the first CM noise and/or the second CM noise.

In some embodiments, the common-mode isolation circuitry may include a number of impedance components. The impedance components may adjust a common-mode impedance between the first cell and the second cell. The common-mode impedance may correspond to a phase shift of the first CM noise, the second CM noise, or both. As such, the common-mode isolation circuitry may include the impedance components to adjust a phase of the first CM noise, adjust a phase of the second CM noise, or both. Accordingly, the common-mode impedance may correspond to a phase shift (e.g., phase relationship) between the first CM noise and the second CM noise.

In turn, the phase shift (e.g., the phase relationship) of the first CM noise and the second CM noise may correspond to reducing the undesired voltage and/or the frequency offsets of the output signal. For example, the phase shift may adjust the phase of the first CM noise and the second CM noise to be out of phase (e.g., inverted, nearly inverted). As such, the switches of the first cell may reduce the undesired voltage and/or the frequency offsets of the output signal caused by the first CM noise based on receiving the second CM noise out of phase (e.g., inverted, nearly inverted) compared to the first CM noise. Similarly, the switches of the second cell may reduce the undesired voltage and/or the frequency offsets of the output signal caused by the second CM noise based on receiving the first CM out of phase (e.g., inverted, nearly inverted) compared to the second CM noise.

In specific embodiments, the common-mode isolation circuitry may include a number of programmable impedance components. In such embodiments, the impedance components may adjust the common-mode impedance between the first cell and the second cell based on receiving control signals. For example, a processor, a controller, and/or any other viable component may generate and/or provide the control signals to adjust the common-mode impedance between the first cell and the second cell. Accordingly, the phase shift (e.g., the phase relationship) between the first CM noise and the second CM noise may be adjusted dynamically.

In some embodiments, an electronic device may include one or multiple VCOs to generate the output signal with one or more oscillation frequencies. The output signal of the VCO may correspond to a clock signal, a carrier signal for signal modulation, a frequency synthesis signal, and/or a frequency down-converted signal based on a received signal of the electronic device, among other things. As such, the VCO may improve operations of the electronic device based on generating improved signals with the desired oscillation frequencies, reduced noise, and/or reduced electrical power. In some embodiments, the improved signals may reduce a timing error rate and/or improve integrity of transmission data and/or reception data, among other things.

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic).

The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive signals between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer, a portable electronic or handheld electronic device such as a wireless electronic device or smartphone, a tablet, a wearable electronic device, and other similar devices. In additional or alternative embodiments, the electronic device 10 may include an access point, such as a base station, a router (e.g., a wireless or Wi-Fi router), a hub, a switch, and so on. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector, a universal serial bus (USB), or other similar connector and protocol. The network interface 26 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FI®), and/or a wide area network (WAN), such as any standards related to the Third Generation Partnership Project (3GPP), including, for example, a $3^{rd}$ generation (3G) cellular network, universal mobile telecommunication system (UMTS), $4^{th}$ generation (4G) cellular network, Long Term Evolution® (LTE) cellular network, Long Term Evolution License Assisted Access (LTE-LAA) cellular network, $5^{th}$ generation (5G) cellular network, and/or New Radio (NR) cellular network, a $6^{th}$ generation (6G) or greater than 6G cellular network, a satellite network, a non-terrestrial network, and so on. In particular, the network interface 26 may include, for example, one or more interfaces for using a cellular communication standard of the 5G specifications that include the millimeter wave (mmWave) frequency range (e.g., 24.25-300 gigahertz (GHz)) that defines and/or enables frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The power source 29 of the electronic device 10 may include any suitable source of power, such as a rechargeable lithium polymer (Li-poly) battery and/or an alternating current (AC) power converter.

Figure 2:
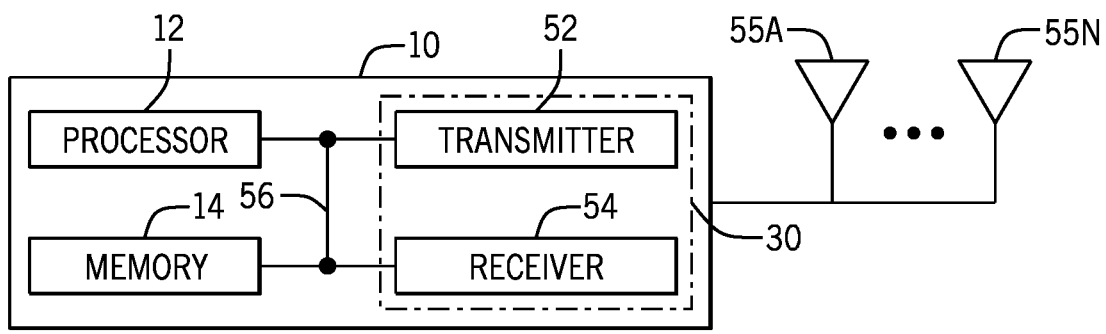
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 30, a transmitter 52, a receiver 54, and/or antennas 55 (illustrated as 55A-55N, collectively referred to as an antenna 55) may be communicatively coupled directly or indirectly (e.g., through or via another component, a communication bus, a network) to one another to transmit and/or receive signals between one another.

The electronic device 10 may include the transmitter 52 and/or the receiver 54 that respectively enable transmission and reception of signals between the electronic device 10 and an external device via, for example, a network (e.g., including base stations or access points) or a direct connection. As illustrated, the transmitter 52 and the receiver 54 may be combined into the transceiver 30. The electronic device 10 may also have one or more antennas 55A-55N electrically coupled to the transceiver 30. The antennas 55A-55N may be configured in an omnidirectional or directional configuration, in a single-beam, dual-beam, or multi-beam arrangement, and so on. Each antenna 55 may be associated with one or more beams and various configurations. In some embodiments, multiple antennas of the antennas 55A-55N of an antenna group or module may be communicatively coupled to a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 54 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

FIG. 3 is a schematic diagram of the transmitter 52 (e.g., transmit circuitry), according to embodiments of the present disclosure. As illustrated, the transmitter 52 may receive outgoing data 60 in the form of a digital signal to be transmitted via the one or more antennas 55. A digital-to-analog converter (DAC) 62 of the transmitter 52 may convert the digital signal to an analog signal. A VCO 63 may generate a carrier signal having a carrier frequency (e.g., a desired oscillation frequency). The VCO 63 may output an output signal (e.g., the carrier signal) to a modulator 64. A modulator 64 may combine the converted analog signal with the carrier signal to generate a radio wave. Alternatively or additionally, the VCO 63 may provide the carrier signal having the carrier frequency to any other viable circuitry, for example, to perform any other viable function.

A power amplifier (PA) 66 (e.g., amplification circuitry) receives the modulated signal from the modulator 64. The power amplifier 66 may amplify the modulated signal to a suitable level to drive transmission of the signal via the one or more antennas 55. A filter 68 (e.g., filter circuitry and/or software) of the transmitter 52 may then remove undesirable noise from the amplified signal to generate transmitted signal 70 to be transmitted via the one or more antennas 55. The filter 68 may include any suitable filter or filters to remove the undesirable noise from the amplified signal, such as a bandpass filter, a bandstop filter, a low pass filter, a high pass filter, and/or a decimation filter.

Although the transmitter 52 is shown to include a single VCO 63, it should be appreciated that the electronic device 10 and/or the transmitter 52 may include additional VCOs 63. In different embodiments, the additional VCOs 63 may perform different operations of the electronic device 10 and/or the transmitter 52 such as frequency synthesis applications and clock generation applications. Furthermore, the power amplifier 66 and/or the filter 68 may be referred to as part of a radio frequency front end (RFFE), and more specifically, a transmit front end (TXFE) of the electronic device 10. Additionally, the transmitter 52 may include any suitable additional components not shown, or may not include certain of the illustrated components, such that the transmitter 52 may transmit the outgoing data 60 via the one or more antennas 55. For example, the transmitter 52 may include a mixer and/or a digital up converter. As another example, the transmitter 52 may not include the filter 68 if the power amplifier 66 outputs the amplified signal in or approximately in a desired frequency range (such that filtering of the amplified signal may be unnecessary).

FIG. 4 is a schematic diagram of the receiver 54 (e.g., receive circuitry), according to embodiments of the present disclosure. As illustrated, the receiver 54 may receive received signal 80 from the one or more antennas 55 in the form of an analog signal. A low noise amplifier (LNA) 82 (e.g., amplification circuitry) may amplify the received analog signal to a suitable level for the receiver 54 to process. A filter 84 (e.g., filter circuitry and/or software) may remove undesired noise from the received signal 80, such as cross-channel interference. The filter 84 may also remove additional signal LNA 82s received by the one or more antennas 55 that are at frequencies other than the desired signal. The filter 84 may include any suitable filter or filters to remove the undesired noise or signals from the received signal 80, such as a bandpass filter, a bandstop filter, a low pass filter, a high pass filter, and/or a decimation filter. The low noise amplifier 82 and/or the filter 84 may be referred to as part of the RFFE, and more specifically, a receiver front end (RXFE) of the electronic device 10.

The receiver 54 may include the VCO 63 receiving the received signal 80. The VCO 63 may receive the received signal 80 from the filter 84. Alternatively or additionally, the VCO 63 may receive the received signal 80 from any other viable circuit (e.g., the one or more antennas 55, LNA 82). In some embodiments, the VCO 63 may generate an output signal with a desired oscillation frequency indicating a frequency and phase of the received signal 80. In alternative or additional embodiments, the VCO 63 may generate an oscillating signal that is mixed with the received signal 80 to produce an intermediate frequency (IF) signal for down conversion of a frequency of the incoming RF signal for processing. Although the receiver 54 is shown to include a single VCO 63, it should be appreciated that the receiver 54 may include additional VCOs 63. For example, the additional VCOs 63 may perform different operations of the receiver 54.

A demodulator 86 may remove a radio frequency carrier signal and/or extract a demodulated signal (e.g., an envelope signal) from the filtered signal for processing. In some embodiments, the demodulator 86 may receive the signal indicating a frequency and phase of the received signal 80 and/or the intermediate frequency (IF) signal from the VCO 63 to generate the remove a radio frequency carrier signal and/or extract a demodulated signal (e.g., an envelope signal) from the filtered signal for processing. An analog-to-digital converter (ADC) 88 may receive the demodulated analog signal and convert the signal to a digital signal of incoming data 90 to be further processed by the electronic device 10. Additionally, the receiver 54 may include any suitable additional components not shown, or may not include certain of the illustrated components, such that the receiver 54 may receive the received signal 80 via the one or more antennas 55. For example, the receiver 54 may include a mixer and/or a digital down converter.

Figure 5:
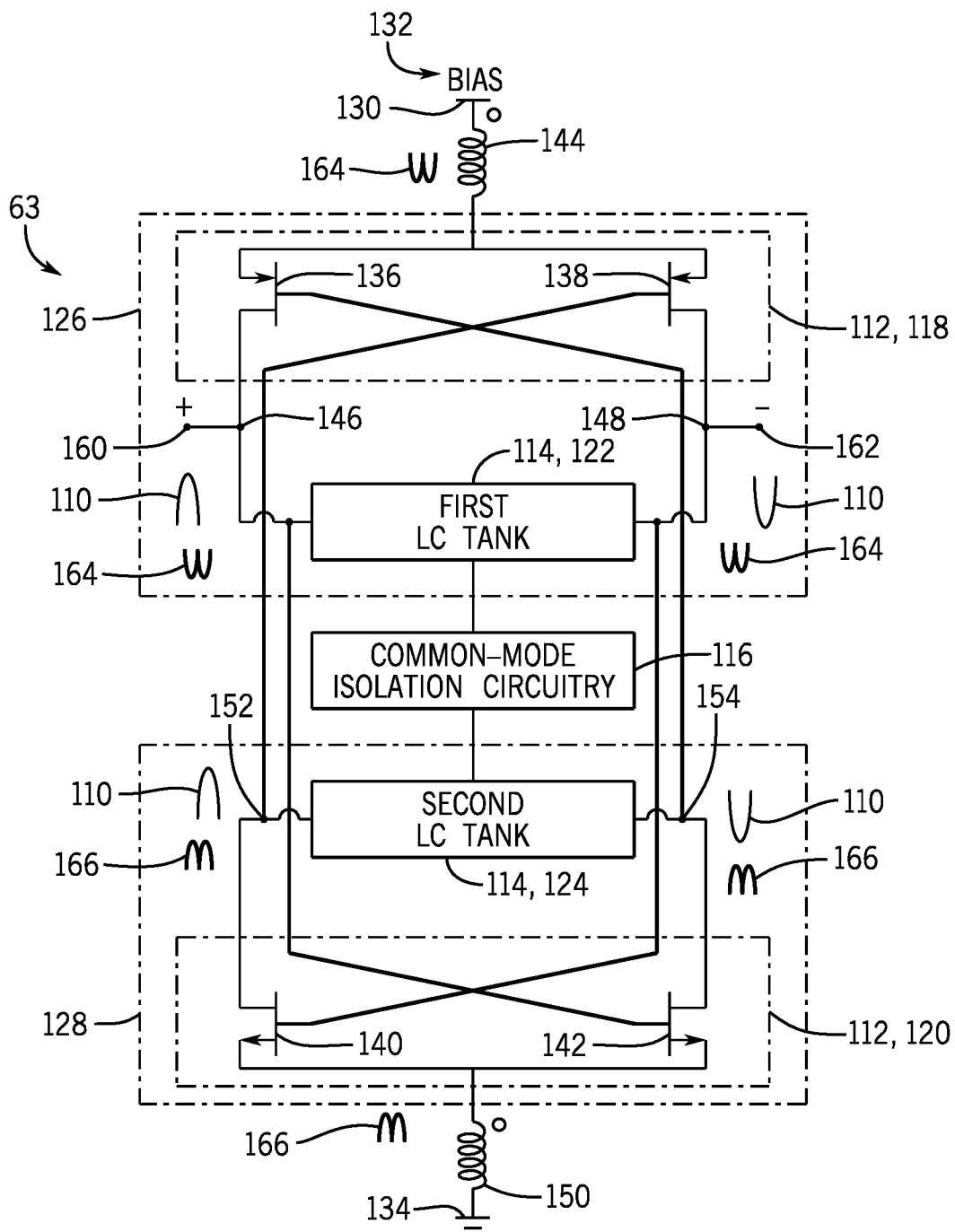
FIG. 5 is a schematic diagram of a voltage-controlled oscillator (VCO) of the transmitter of FIG. 3 and/or the receiver of FIG. 4 that may generate an output signal, according to embodiments of the present disclosure, according to embodiments of the present disclosure.

FIG. 5 is a schematic diagram of the VCO 63 of the transmitter 52 and/or the receiver 54 that may generate an output signal 110, according to embodiments of the present disclosure. The VCO 63 may include CMOS circuitry 112 (e.g., current-source circuitry), inductor-capacitor (LC) tank circuitry 114 (e.g., resonator circuitry), and common-mode isolation circuitry 116. The CMOS circuitry 112 may include an n-channel metal-oxide semiconductor (NMOS) circuit 118 (e.g., a first voltage-controlled current source) and a p-channel metal-oxide semiconductor (PMOS) circuit 120 (e.g., a second voltage-controlled current source). The LC tank circuitry 114 may include a first LC tank circuit 122 and a second LC tank circuit 124.

The VCO 63 may include a first cell 126 and a second cell 128, each including a portion of the CMOS circuitry 112 and the LC tank circuitry 114. In particular, the first cell 126 may include the NMOS circuit 118 and the first LC tank circuit 122. Moreover, the second cell 128 may include the PMOS circuit 120 and the second LC tank circuit 124.

In different embodiments, the common-mode isolation circuitry 116 may be disposed on and/or may be coupled to the first cell 126 and/or the second cell 128. In some embodiments, the common-mode isolation circuitry 116 may couple the first cell 126 to the second cell 128 for signals having a desired oscillation frequency within a resonant frequency range and/or equal to a high threshold or a low threshold of the resonant frequency range (e.g., the output signal 110). In alternative or additional embodiments, the common-mode isolation circuitry 116 may couple the first cell 126 to the second cell 128 for DC signals and signals having the desired oscillation frequency. Moreover, the common-mode isolation circuitry 116 may uncouple (e.g., inductively uncouple) the first cell 126 from the second cell 128 for signals having an undesired oscillation frequency outside the resonant frequency range.

In the depicted embodiment, the NMOS circuit 118 may be coupled to a voltage source 130 to receive a bias voltage 132 (e.g., a DC signal). Alternatively or additionally, the VCO 63 may receive a received signal 80 discussed above in addition or in lieu of the bias voltage 132 from any other viable circuit (e.g., the one or more antennas 55, the amplification circuitry, LNA 82). In any case, the NMOS circuit 118 may generate a DC signal with an amount of electrical current based on receiving the bias voltage 132 and/or the received signal 80, among other possibilities. Moreover, the VCO 63 may generate and output the output signal 110 during operation based on receiving the bias voltage 132, the received signal 80, and/or any other viable input signal. In some embodiments, the power amplifier 66 discussed above may amplify the output signal 110 (e.g., the modulated signal) to a suitable level to drive transmission of the signal via the one or more antennas 55.

In some embodiments, the VCO 63 may generate the output signal 110 with an oscillation frequency (e.g., the desired oscillation frequency) based on a frequency and phase of the received signal 80. In alternative or additional embodiments, the VCO 63 may generate the output signal 110 with an oscillation frequency (e.g., the desired oscillation frequency) corresponding to a carrier signal having the carrier frequency for transmitting outgoing data 60 discussed above. In yet alternative or additional embodiments, the VCO 63 may generate the output signal 110 corresponding to an oscillating signal for mixing with the received signal 80 to produce an intermediate frequency (IF) signal for down conversion of a frequency of the incoming RF signal for processing.

The NMOS circuit 118 may be differentially coupled to the first LC tank circuit 122. The common-mode isolation circuitry 116 may include a first inductor on the first cell 126 and a second inductor on the second cell 128. Moreover, the first LC tank circuit 122 may include the first inductor and the second LC tank circuit 124 may include the second inductor. During operation of the VCO 63, the first LC tank circuit 122 may inductively couple to the second LC tank circuit 124 via the first inductor and the second inductor of the common-mode isolation circuitry 116. In some embodiments, the common-mode isolation circuitry 116 may include a transmission line, a transformer, and/or an impedance component to couple the first cell 126 to the second cell 128. In such embodiments, the first LC tank circuit 122 may be coupled to the second LC tank circuit 124 via the common-mode isolation circuitry 116.

The second LC tank circuit 124 may be differentially coupled to the PMOS circuit 120. The PMOS circuit 120 may be coupled to a ground terminal 134. For example, the ground terminal 134 may have a ground voltage, such as a virtual ground voltage, 0 volts, or near 0 volts. The PMOS circuit 120 may generate the DC signal with the amount of electrical current with the NMOS circuit 118 based on the bias voltage 132 and/or the received signal 80, among other possibilities. The NMOS circuit 118 and the PMOS circuit 120 may each include a voltage-controlled current source to output the DC signal (e.g., the electrical current) to the first LC tank circuit 122 and the second LC tank circuit 124. The NMOS circuit 118 and the PMOS circuit 120 may provide the DC signal based on receiving the bias voltage 132 (or any other viable input signal) and the ground voltage.

The first LC tank circuit 122, the second LC tank circuit 124, and/or the common-mode isolation circuitry 116 may at least partly share the resonant frequency range. For example, the first LC tank circuit 122 and the second LC tank circuit 124 may have a resonant frequency corresponding to the desired oscillation frequency within the resonant frequency range. Moreover, the common-mode isolation circuitry 116 may inductively couple the first cell 126 to the second cell 128 for the signals having the desired oscillation frequency within the resonant frequency range. In some embodiments, the common-mode isolation circuitry 116 may additionally couple the first cell 126 to the second cell 128 for the DC signal. Accordingly, the first LC tank circuit 122 and the second LC tank circuit 124 may generate the output signal 110 (e.g., a differential output signal) having the desired oscillation frequency within the resonant frequency range based on receiving the DC signal.

In some embodiments, the common-mode isolation circuitry 116 may include the transmission line, the transformer, and/or the impedance component associated with the resonant frequency range. The common-mode isolation circuitry 116 may at least partly isolate common-mode signals of the first cell 126 and the second cell 128 having the undesired oscillation frequency outside the resonant frequency range. For example, the common-mode isolation circuitry 116 may at least partially uncouple (e.g., inductively uncouple) the first cell 126 from the second cell 128 for the common-mode signals of the first cell 126 and the second cell 128 having the undesired oscillation frequency outside the resonant frequency range.

In the depicted embodiment, the NMOS circuit 118 may include a first switch 136 (e.g., a first NMOS switch) and a second switch 138 (e.g., a second NMOS switch) forming a first voltage-controlled current source. Moreover, the PMOS circuit 120 may include a third switch 140 (e.g., a first PMOS switch) and a fourth switch 142 (e.g., a second PMOS switch) forming a second voltage-controlled current source. It should be appreciated that in alternative or additional embodiments, the NMOS circuit 118 and/or the PMOS circuit 120 may each include different switches, such as any viable transistor, and/or a different number of switches to provide the voltage-controlled current source.

Source terminals of the first switch 136 and the second switch 138 may be coupled to the voltage source 130 via a first degeneration inductor 144. The first degeneration inductor 144 may reduce noise and/or leakage of the voltage source 130 at the VCO 63 and/or reduce noise and/or leakage of the VCO 63 at the voltage source 130. Moreover, source terminals of the third switch 140 and the fourth switch 142 may be coupled to the ground terminal 134 via a second degeneration inductor 150. The second degeneration inductor 150 may reduce noise and/or leakage of the ground terminal 134 at the VCO 63 and/or reduce noise and/or leakage of the VCO 63 at the ground terminal 134.

Gate terminals of the first switch 136 and the second switch 138 of the first cell 126 may be cross-coupled to drain terminals of the fourth switch 142 and the third switch 140 of the second cell 128 respectively. In particular, a gate terminal of the first switch 136 may be coupled to a drain terminal of the fourth switch 142 via a fourth node 154. As such, a gate voltage of the first switch 136 of the first cell 126 may correspond to a drain voltage (e.g., an output voltage) of the fourth switch 142 of the second cell 128. A gate terminal of the second switch 138 may be coupled to a drain terminal of the third switch 140 via a third node 152. As such, a gate voltage of the second switch 138 of the first cell 126 may correspond to a drain voltage (e.g., an output voltage) of the third switch 140 of the second cell 128. The gate voltages of the switches 136 and 138 of the first cell 126 may reduce undesired voltage and/or the frequency offsets of the output signal 110 on the first cell 126, as will be appreciated.

Moreover, gate terminals of the third switch 140 and the fourth switch 142 of the second cell 128 may be cross-coupled to drain terminals of the second switch 138 and the first switch 136 of the first cell 126 respectively. In particular, a gate terminal of the third switch 140 may be coupled to a drain terminal of the second switch 138 via a second node 148. As such, a gate voltage of the third switch 140 of the second cell 128 may correspond to a drain voltage (e.g., an output voltage) of the second switch 138 of the first cell 126. A gate terminal of the fourth switch 142 may be coupled to a drain terminal of the first switch 136 via a first node 146. As such, a gate voltage of the fourth switch 142 of the second cell 128 may correspond to a drain voltage (e.g., an output voltage) of the first switch 136 of the first cell 126. The gate voltages of the switches 140 and 142 of the second cell 128 may reduce undesired voltage and/or the frequency offsets of the output signal 110 on the second cell 128, as will be appreciated.

The drain terminal of the first switch 136 may be coupled to the first LC tank circuit 122 via the first node 146. The drain terminal of the second switch 138 may be coupled to the first LC tank circuit 122 via the second node 148. Moreover, the drain terminal of the third switch 140 may be coupled to the second LC tank circuit 124 via the third node 152. The drain terminal of the fourth switch 142 may be coupled to the second LC tank circuit 124 via the fourth node 154.

In the depicted embodiment, the drain terminal of the first switch 136 may be coupled to a positive output terminal 160 via the first node 146. Moreover, the drain terminal of the second switch 138 may be coupled to a negative output terminal 162 via the second node 148. As such, the positive output terminal 160 and the negative output terminal 162 may output the output signal 110.

It should be appreciated that in alternative or additional embodiments, the drain terminal of the third switch 140 may be coupled to a second positive output terminal via the third node 152 and the drain terminal of the fourth switch 142 may be coupled to a second negative output terminal via the fourth node 154. For example, the VCO 63 may include the second positive output terminal and the second negative output terminal in lieu of or in addition to the positive output terminal 160 and the negative output terminal 162. Accordingly, in alternative or additional embodiments, the second positive output terminal and the second negative output terminal may output the output signal 110 in lieu of or in addition to the positive output terminal 160 and the negative output terminal 162.

In different embodiments, the first LC tank circuit 122 and the second LC tank circuit 124 may include a different number of capacitors and inductors to generate the output signal 110. In specific cases, a capacitance value and an inductance value of the first LC tank circuit 122 and the second LC tank circuit 124 may be equal, nearly equal, or substantially equal. The capacitance value and the inductance value of the first LC tank circuit 122 and the second LC tank circuit 124 may correspond to the desired oscillation frequency of the output signal 110. As such, adjusting the capacitance value and/or the inductance value of the first LC tank circuit 122 and the second LC tank circuit 124 may adjust or tune the desired oscillation frequency of the output signal 110 within the resonant frequency range. In some cases, the desired oscillation frequency may be above a threshold (e.g., above 0.1 GHZ, above 1 GHz, above 10 GHZ, above 19 GHz, and so on) or within the resonant frequency range (e.g., 24.25-300 GHz or mmWave frequencies, among other possibilities).

As mentioned above, the first LC tank circuit 122, the second LC tank circuit 124, and/or the common-mode isolation circuitry 116 may at least partly share the resonant frequency range. Moreover, the common-mode isolation circuitry 116 may inductively couple the first LC tank circuit 122 and the second LC tank circuit 124 for signals having the desired oscillation frequency within the resonant frequency range. For example, the common-mode isolation circuitry 116 may include a transformer having the resonant frequency range. As such, the common-mode isolation circuitry 116 may inductively couple the first LC tank circuit 122 and the second LC tank circuit 124 for the output signal 110 having the desired oscillation frequency.

In some embodiments, the first LC tank circuit 122 and the second LC tank circuit 124 may generate the output signal 110 having the desired oscillation frequency based on inductively coupling the first LC tank circuit 122 to the second LC tank circuit 124 via the common-mode isolation circuitry 116. In alternative or additional embodiments, the first LC tank circuit 122 and the second LC tank circuit 124 may generate the output signal 110 based on cross-coupling the gate terminals of the switches 136 and 138 of the first cell 126 to the drain terminals of the switches 136 and 138 of the second cell 128. Moreover, in some embodiments, the first LC tank circuit 122 and the second LC tank circuit 124 may generate the output signal 110 based on cross-coupling the gate terminals of the switches 136 and 138 of the second cell 128 to the drain terminals of the switches 136 and 138 of the first cell 126. In alternative or additional embodiments, the first LC tank circuit 122 and the second LC tank circuit 124 may generate the output signal 110 based on coupling the first LC tank circuit 122 to the second LC tank circuit 124 by a transmission line and/or one or more impedance components. Accordingly, the VCO 63 may output the output signal 110 having the desired oscillation frequency within the resonant frequency range.

In some cases, if not accounted for, the first switch 136, the second switch 138, the third switch 140, and/or the fourth switch 142 may include non-linear parasitic capacitors having non-linear capacitance values during operation. In additional or alternative cases, the first LC tank circuit 122 and/or the second LC tank circuit 124 may each include one or more non-linear capacitors (e.g., varactors) and/or one or more non-linear parasitic capacitors having non-linear capacitance values during operation. A voltage fluctuation across a non-linear capacitor may correspond to a change in the capacitance value of the non-linear capacitor.

Additionally, if not accounted for, capacitance value changes of the non-linear capacitors may generate undesired CM noises 164 and 166 in response to undesired voltage fluctuations. In different cases, the voltage fluctuations may be caused by thermally induced noises, power supply voltage fluctuations, a gate induced noise of one or more switches of the VCO, a noise of one or more VCO materials and/or components, a noise due to manufacturing processes and/or manufacturing process variations, a flicker noise of one or more Complementary Metal-Oxide-Semiconductor (CMOS) components of the VCO, or a combination thereof, among other things.

In the depicted embodiment, the first cell 126 may include a first portion of (e.g., half of, near half of) non-linear capacitors of the VCO 63 and the second cell 128 may include a remaining portion of (e.g., half of, near half of) the non-linear capacitors. The first cell 126 may generate a portion of (e.g., half of, near half of) an entirety of the CM noises of the VCO 63 (e.g., the first CM noise 164). The second cell 128 may generate a remaining portion of (e.g., half of, near half of) the entirety of the CM noises of the VCO 63 (e.g., the second CM noise 166). The CM noises 164 and 166 may have an undesired oscillation frequency outside the resonant frequency range of the common-mode isolation circuitry 116.

As such, the common-mode isolation circuitry 116 may inductively uncouple the first cell 126 from the second cell 128 for the CM noises 164 and 166. Accordingly, the first cell 126 may generate the first CM noise 164 at least partially uncoupled and/or isolated from the second CM noise 166 of the second cell 128. In some cases, the CM noises 164 and 166 may have the undesired oscillation frequency below a threshold (e.g., below 1 GHZ, below 220 kilohertz (KHz), below 100 KHz, and so on). The CM noises 164 and 166 may have a higher oscillation frequency than the DC signal. For example the DC signal may have an oscillation frequency below a threshold (e.g., below 100 KHz, below 10 KHz, below 1 KHz, and so on) lower than the undesired oscillation frequency of the CM noises 164 and 166.

As mentioned above, the output terminals 160 and 162 of the VCO 63 may be disposed on the first cell 126. As such, the VCO 63 may output the output signal 110 with the first CM noise 164 of the first cell 126 via the output terminals 160 and 162. Moreover, in alternative or additional embodiments, the VCO 63 may include the second output terminals disposed on the second cell 128. In such embodiments, the VCO 63 may output the output signal 110 with the second CM noise 166 of the second cell 128 via the second output terminals. In any case, the VCO 63 may output the output signal 110 with a portion of the CM noise 164 or 166 of the VCO 63 as compared to the entirety of the CM noises 164 and 166 of the VCO 63. Accordingly, the VCO 63 may reduce an amplitude of the undesired noises to improve phase noise of the output signal 110.

Moreover, the switches 136 and 138 of the first cell 126 may conduct the first CM noise 164 away from the common-mode isolation circuitry 116 and the switches 136 and 138 of the second cell 128 may conduct the second CM noise 166 away from the common-mode isolation circuitry 116. As such, the first CM noise 164 of the first cell 126 and the second CM noise 166 of the second cell 128 may have different (e.g., near opposite, opposite) amplitude and/or phase. Moreover, the first cell 126 may include the output signal 110 and the first CM noise 164 and the second cell 128 may include the output signal 110 and the second CM noise 166. As mentioned above, the CM noises 164 and/or 166 may cause the undesired voltage and/or the frequency offsets of the output signal 110. Accordingly, if not compensated for, the first cell 126 and the second cell 128 may each include the output signal 110 with different (e.g., near opposite, opposite) perturbations.

As described above, the gate terminals of the switches 136 and 138 of the first cell 126 may be coupled to the drain terminals of the switches 142 and 140 of the second cell 128 respectively. Moreover, the gate terminals of the switches 140 and 142 of the second cell 128 may be coupled to the drain terminals of the switches 138 and 136 of the first cell 126 respectively. During operation of the VCO 63, the first cell 126 and the second cell 128 may both include the output signal 110 while the first cell 126 may include the first CM noise 164 uncoupled from the second CM noise 166 of the second cell 128. As mentioned above, the first CM noise 164 of the first cell 126 and the second CM noise 166 of the second cell 128 may have different (e.g., near opposite, opposite) amplitude and/or phase.

As such, the switches 136 and 138 of the first cell 126 may reduce the undesired voltage and/or the frequency offsets of the output signal 110 caused by the first CM noise 164 based on receiving the second CM noise 166. For example, the gate terminals of the switches 136 and 138 may reduce an amplitude change and/or phase shift of the output signal 110 by the first CM noise 164 on the first cell 126 based on receiving the second CM noise 166. Moreover, the switches 140 and 142 of the second cell 128 may reduce the undesired voltage and/or the frequency offsets of the output signal 110 caused by the second CM noise 166 based on receiving the first CM noise 164. For example, the gate terminals of the switches 140 and 142 may reduce an amplitude change and/or phase shift of the output signal 110 by the second CM noise 166 on the second cell 128 based on receiving the first CM noise 164. Accordingly, the gate voltage interdependency of the switches 136, 138, 140, and 142 of the first cell 126 and the second cell 128 may reduce the undesired voltage and/or the frequency offsets of the output signal 110 based on the first CM noise 164 and/or the second CM noise 166.

With the foregoing in mind, the VCO 63 may consume an amount of electrical power to generate the output signal 110 with a reduced phase noise compared to other VCOs. That is, the VCO 63 may have improved signal-to-noise ratio (SNR) for generating the output signal 110 without increased power consumption. Alternatively or additionally, the VCO 63 may generate the output signal 110 with a phase noise by consuming a reduced amount of electrical power compared to other VCOs. That is, the VCO 63 may have improved efficiency for generating the output signal 110 with the phase noise. Accordingly, the VCO 63 may improve operations of the transmitter 52, the receiver 54, and/or the electronic device 10 based on generating signals with improved signal integrity based the reduced noise and/or improved efficiency based on the reduced power consumption. For example, the improved signals may reduce a timing error rate and/or improve integrity of transmission data and/or reception data, among other things.

Figure 6:
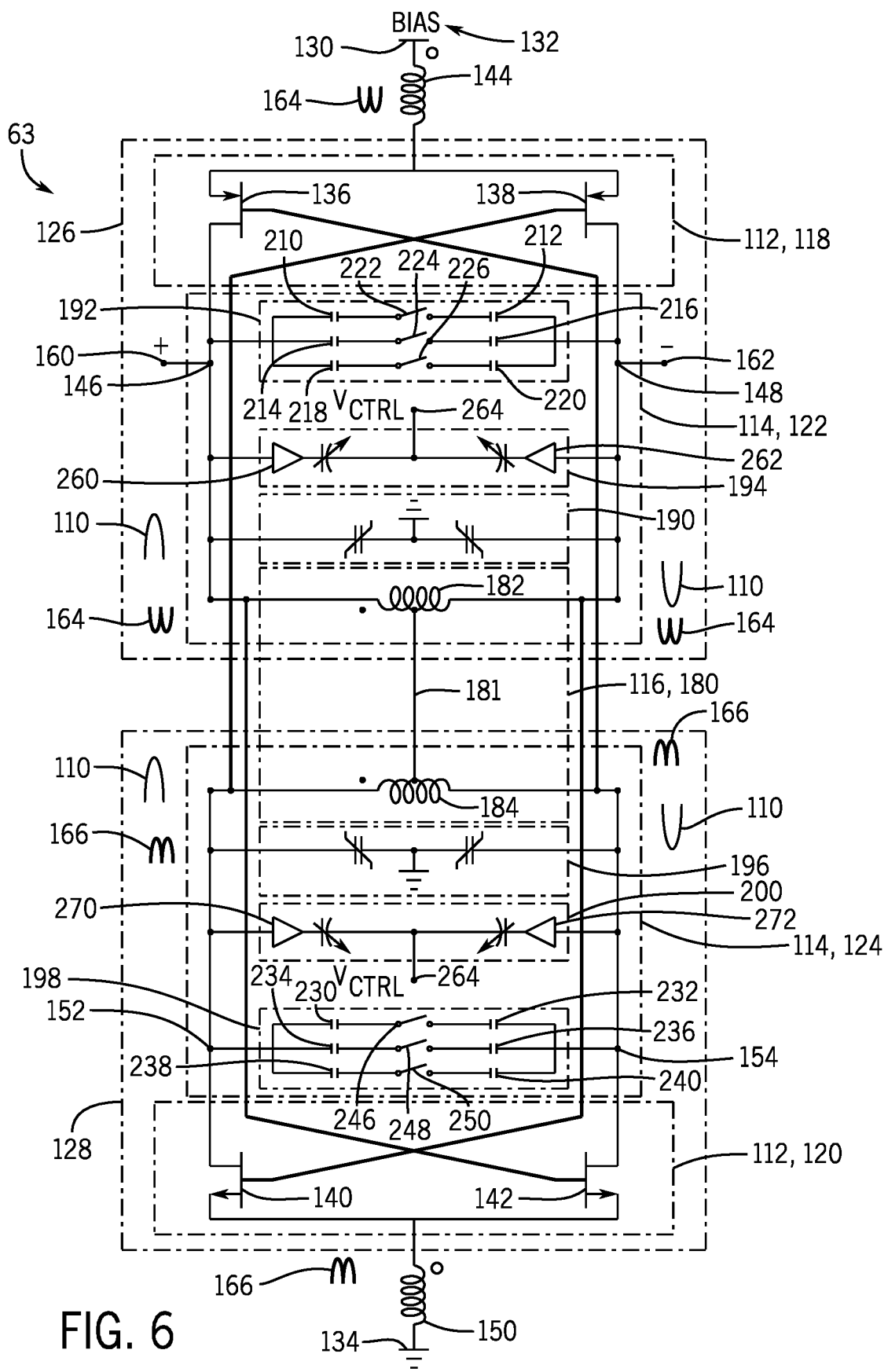
FIG. 6 is a schematic diagram of the VCO of FIG. 5 where the common-mode isolation circuitry includes a transmission line and a transformer, according to embodiments of the present disclosure.

FIG. 6 is a schematic diagram of the VCO 63 where the common-mode isolation circuitry 116 includes a transmission line 181 and a transformer 180, according to embodiments of the present disclosure. The transformer 180 may include a first inductor 182 and a second inductor 184. The NMOS circuit 118 and the PMOS circuit 120 may generate the DC signal based on receiving the bias voltage 132 of the voltage source 130 (or any other viable input signal). Accordingly, the first LC tank circuit 122 and the second LC tank circuit 124 may generate the output signal 110 based on the DC signal.

In some embodiments, the NMOS circuit 118 and the PMOS circuit 120 may generate the DC signal based on inductively coupling the first inductor 182 to the second inductor 184 in response to receiving the bias voltage 132. In alternative or additional embodiments, the NMOS circuit 118 and the PMOS circuit 120 may generate the DC signal in response to receiving the bias voltage 132 based on cross-coupling the gate terminal of the first switch 136 to the drain terminal of the fourth switch 142 via the fourth node 154, the gate terminal of the second switch 138 to the drain terminal of the third switch 140 via the third node 152, the gate terminal of the third switch 140 to the drain terminal of the second switch 138 via the second node 148, the gate terminal of the fourth switch 142 to the drain terminal of the first switch 136 via the first node 146, or a combination thereof.

The first cell 126 may include the first inductor 182 and the second cell 128 may include the second inductor 184. The first inductor 182 may be coupled to the drain terminal of the first switch 136 via the first node 146 and may be coupled to the drain terminal of the second switch 138 via the second node 148. The second inductor 184 may be coupled to the drain terminal of the third switch 140 via the third node 152 and may be coupled to the drain terminal of the fourth switch 142 via the fourth node 154. As such, the first inductor 182 and the second inductor 184 may differentially receive the DC signal in response to the VCO 63 receiving the bias voltage 132 (or any other viable input signal).

The first inductor 182 and the second inductor 184 may inductively couple with a coupling factor (K) equal to or above a first threshold for signals having an oscillation frequency within the resonant frequency range. The first threshold may be 0.3, 0.4, 0.44, 0.5, 0.72, 0.76, 0.9, or 1, among other possibilities. In different embodiments, the first inductor 182 and the second inductor 184 may have different dimensions corresponding to the resonant frequency range.

As mentioned above, the first LC tank circuit 122 and the second LC tank circuit 124 may generate the output signal 110 having the desired oscillation frequency within the resonant frequency range. As such, the first inductor 182 may inductively couple to the second inductor 184 for the output signal 110 of the VCO 63 based on the output signal 110 having the desired oscillation frequency. Accordingly, the transformer 180 may inductively couple the first cell 126 to the second cell 128 for the output signal 110.

Moreover, the first inductor 182 and the second inductor 184 may inductively uncouple for signals having an oscillation frequency outside the resonant frequency range based on a coupling factor equal to or below a second threshold. The second threshold may be 1, 0.9, 0.85, 0.72, 0.64, 0.5, 0.4, 0.2, 0.1, or 0.5, among other possibilities. As such, the first inductor 182 and the second inductor 184 may inductively uncouple for the CM noises 164 and 166 having the undesired oscillation frequency outside the resonant frequency range. Accordingly, the transformer 180 may at least partly uncouple and/or isolate the first cell 126 from the second cell 128 for the CM noises 164 and 166.

Furthermore, the transmission line 181 may be coupled to the first inductor 182 and the second inductor 184 of the transformer 180, according to embodiments of the present disclosure. For example, the transmission line 181 may be tapped onto or coupled to the first inductor 182 and the second inductor 184. The transmission line 181 may conduct the DC signal (e.g., the electrical currents) between the first cell 126 and the second cell 128. Accordingly, the NMOS circuit 118 and the PMOS circuit 120 may generate the DC signal based on the bias voltage 132 (or any other viable input signal) and based on the transmission line 181 coupling the first inductor 182 and the second inductor 184.

In the depicted embodiment, the first LC tank circuit 122 may include the first inductor 182, a first capacitor bank 190, a first switched capacitor circuit 192, and a first varactor 194. Moreover, the second LC tank circuit 124 may include the second inductor 184, a second capacitor bank 196, a second switched capacitor circuit 198, and a second varactor 200. In some cases, a capacitance value and an inductance value of the first LC tank circuit 122 and the second LC tank circuit 124 may be equal, nearly equal, or substantially equal. It should be appreciated that in different embodiments, the first LC tank circuit 122 and the second LC tank circuit 124 may include different circuit components. For example, the first LC tank circuit 122 and the second LC tank circuit 124 may include a different number of capacitors and/or inductors to generate the output signal 110.

The first capacitor bank 190 and the second capacitor bank 196 may each include a number of capacitors. In some embodiments, one or more of the capacitors of the first capacitor bank 190 and/or the second capacitor bank 196 may be coupled to the ground terminal 134. It should be appreciated that in different embodiments, the first capacitor bank 190 and the second capacitor bank 196 may each include a different number of capacitors. In some cases, the first capacitor bank 190 and the second capacitor bank 196 may each include a number of non-linear capacitors.

The first switched capacitor circuit 192 may include primary capacitors 210, 212, 214, 216, 218, and 220 and primary switches 222, 224, and 226. The first primary capacitor 210 and the second primary capacitor 212 may couple to the positive output terminal 160 and the negative output terminal 162 via the first node 146 and the second node 148, respectively, based on closing the first primary switch 222. The third primary capacitor 214 and the fourth primary capacitor 216 may couple to the positive output terminal 160 and the negative output terminal 162 via the first node 146 and the second node 148, respectively, based on closing the second primary switch 224. The fifth primary capacitor 218 and the sixth primary capacitor 220 may couple to the positive output terminal 160 and the negative output terminal 162 via the first node 146 and the second node 148, respectively, based on closing the third primary switch 226.

The second switched capacitor circuit 198 may include secondary capacitors 230, 232, 234, 236, 238, and 240 and secondary switches 246, 248, and 250. The first secondary capacitor 230 and the second secondary capacitor 232 may couple to the positive output terminal 160 and the negative output terminal 162 via the third node 152 and the fourth node 154, respectively, based on closing the first secondary switch 246. The third secondary capacitor 234 and the fourth secondary capacitor 236 may couple to the positive output terminal 160 and the negative output terminal 162 via the third node 152 and the fourth node 154, respectively, based on closing the second secondary switch 248. The fifth secondary capacitor 238 and the sixth secondary capacitor 240 may couple to the positive output terminal 160 and the negative output terminal 162 via the third node 152 and the fourth node 154, respectively, based on closing the third secondary switch 250.

As described above, the electronic device 10 may include the VCO 63. In some embodiments, the processor 12 of the electronic device 10 may generate control signals to open and close each of the primary switches 222, 224, and 226 and/or the secondary switches 246, 248, and 250 to adjust the capacitance value of the first LC tank circuit 122 and the second LC tank circuit 124. Alternatively or additionally, any other viable circuitry may generate the control signals.

The capacitance value and the inductance value of the first LC tank circuit 122 and the second LC tank circuit 124 may be equal, nearly equal, or substantially equal. In some cases, each of the primary capacitors 210, 212, 214, 216, 218, and 220 may have a capacitance value corresponding to a capacitance value of a respective secondary capacitor 230, 232, 234, 236, 238, and 240. In specific cases, each of the primary capacitors 210, 212, 214, 216, 218, and 220 may have a capacitance value equal to or near equal to a capacitance value of a respective secondary capacitor 230, 232, 234, 236, 238, and 240.

Moreover, the processor 12 may open and close the first primary switch 222 with the first secondary switch 246, the second primary switch 224 with the second secondary switch 248, and the third primary switch 226 with the third secondary switch 250. Accordingly, the capacitance value and the inductance value of the first LC tank circuit 122 and the second LC tank circuit 124 may be adjusted equally, near equally, or substantially equally in response to opening and closing the primary switches 222, 224, and 226 and/or the secondary switches 246, 248, and 250.

The first varactor 194 may include a first primary junction diode 260 and a second primary junction diode 262. The second varactor 200 may include a first secondary junction diode 270 and a second secondary junction diode 272. The first varactor 194 and the second varactor 200 may receive a tuning voltage (VCTRL) 264 (or control voltage 264) to adjust and/or control a capacitance value of the first primary junction diode 260, the second primary junction diode 262, the first secondary junction diode 270, and the second secondary junction diode 272. In some cases, the processor 12 may generate the tuning voltage 264. Alternatively or additionally, any other viable circuitry may generate the tuning voltage 264.

As mentioned above, the capacitance value and the inductance value of the first LC tank circuit 122 and the second LC tank circuit 124 may be equal, nearly equal, or substantially equal. In some cases, each of the first primary junction diode 260, the first secondary junction diode 270, the second primary junction diode 262, and the second secondary junction diode 272 may have corresponding capacitance values (e.g., an equal or near equal capacitance value). Moreover, the tuning voltage 264 may be provided to the first varactor 194 and the second varactor 200. Accordingly, the capacitance value and the inductance value of the first LC tank circuit 122 and the second LC tank circuit 124 may be adjusted equally, near equally, or substantially equally based on tuning the first varactor 194 and the second varactor 200.

The capacitance value of the first LC tank circuit 122 and the second LC tank circuit 124 may correspond to the desired oscillation frequency of the output signal 110. As such, adjusting the capacitance value of the first LC tank circuit 122 and the second LC tank circuit 124 may adjust the desired oscillation frequency of the output signal 110.

Accordingly, opening and closing the primary switches 222, 224, and 226 and secondary switches 246, 248, and 250 and/or adjusting the voltage value of the tuning voltage 264 may tune the desired oscillation frequency of the output signal 110.

As discussed above, the first cell 126 may include a first portion of (e.g., half of, near half of) non-linear capacitors of the VCO 63 and the second cell 128 may include a remaining portion of (e.g., half of, near half of) the non-linear capacitors. In some embodiments, one or more capacitors of the first capacitor bank 190 and/or the second capacitor bank 196 may have non-linear capacitance values and/or may form non-linear parasitic capacitors during operation of the VCO 63. Alternatively or additionally, one or more of the primary capacitors 210, 212, 214, 216, 218, and/or 220 of the first switched capacitor circuit 192 and/or one or more of the secondary capacitors 230, 232, 234, 236, 238, and/or 240 of the second switched capacitor circuit 198 may have non-linear capacitance values and/or may form non-linear parasitic capacitors during operation of the VCO 63. Alternatively or additionally, one or more of the first primary junction diode 260, the first secondary junction diode 270, the second primary junction diode 262, and the second secondary junction diode 272 of the first varactor 194 and/or the second varactor 200 may have non-linear capacitance values and/or may form non-linear parasitic capacitors during operation of the VCO 63. Furthermore, each of the switches 136, 138, 140, and/or 142 may form one or more non-linear parasitic capacitors between one or more respective terminals during operation of the VCO 63.

In any case, as mentioned above, the capacitance value and the inductance value of the first LC tank circuit 122 and the second LC tank circuit 124 may be equal, nearly equal, or substantially equal. In some cases, capacitance variations based on the non-linear capacitance values of the first LC tank circuit 122 of the first cell 126 and the second LC tank circuit 124 of the second cell 128 may also be equal, nearly equal, or substantially equal. As such, the first cell 126 and the second cell 128 may each generate a respective portion of an entirety of CM noises 164 and 166 of the VCO 63 when generating the output signal 110 with the desired oscillation frequency. Moreover, the transformer 180 may at least partly uncouple and/or isolate the first cell 126 from the second cell 128 for the CM noises 164 and 166. Accordingly, the first cell 126 and the second cell 128 may each include an equal portion of, half of, or near half of the entirety of CM noises 164 and 166 during operation of the VCO 63.

Furthermore, the gate terminals of the switches 136 and 138 may reduce an amplitude change and/or phase shift of the output signal 110 by the first CM noise 164 on the first cell 126 based on receiving the second CM noise 166. Moreover, the gate terminals of the switches 140 and 142 may reduce an amplitude change and/or phase shift of the output signal 110 by the second CM noise 166 on the second cell 128 based on receiving the first CM noise 164. As such, inductive coupling between the first cell 126 and the second cell 128 via the common-mode isolation circuitry 116 and the gate voltage interdependency of the switches 136, 138, 140, and 142 of the first cell 126 and the second cell 128 may reduce the undesired voltage and/or the frequency offsets of the output signal 110 based on the first CM noise 164 and/or the second CM noise 166.

Accordingly, the VCO 63 may have improved SNR for generating the output signal 110 without increased power consumption. Alternatively or additionally, the VCO 63 may generate the output signal 110 with a phase noise by consuming a reduced amount of electrical power compared to other VCOs. That is, the VCO 63 may have improved efficiency for generating the output signal 110 with the phase noise. Accordingly, the VCO 63 may improve operations of the transmitter 52, the receiver 54, and/or the electronic device 10 based on generating signals with improved signal integrity based the reduced noise and/or improved efficiency based on the reduced power consumption. For example, the improved signals may reduce a timing error rate and/or improve integrity of transmission data and/or reception data, among other things.

With the foregoing in mind, the first LC tank circuit 122 may include a portion of the common-mode isolation circuitry 116 based on including the first inductor 182. Moreover, the second LC tank circuit 124 may include a second portion of the common-mode isolation circuitry 116 based on including the second inductor 184. The first inductor 182 may form the first LC tank circuit 122 with the first capacitor bank 190, the first switched capacitor circuit 192, and the first varactor 194 and may form the common-mode isolation circuitry 116 with the second inductor 184. Similarly, the second inductor 184 may form the second LC tank circuit 124 with the second capacitor bank 196, the second switched capacitor circuit 198, and the second varactor 200 and may form the common-mode isolation circuitry 116 with the first inductor 182. That is, the common-mode isolation circuitry 116, the first LC tank circuit 122, and the second LC tank circuit 124 may share the first LC tank circuit 122 and the second inductor 184. As such, in some embodiments, the common-mode isolation circuitry 116, the first LC tank circuit 122, and/or the second LC tank circuit 124 may occupy less area based on sharing the first LC tank circuit 122 and the second inductor 184 compared to having exclusive inductors that are not shared.

Moreover, the first inductor 182 may be disposed in proximity of the second inductor 184. In some embodiments, the second inductor 184 may be overlaid on or under the first inductor 182, for example, on or into a printed circuit board (PCB), among other possibilities. As such, the first inductor 182 and the second inductor may occupy less area compared to an area occupied by the first inductor 182 and the second inductor 184 being disposed with a different disposition (e.g., side-by-side). In some cases, the first inductor 182 and the second inductor 184 may occupy an area corresponding to an area of either of the first inductor 182 or the second inductor 184 that is less than the area occupied by the first inductor 182 and the second inductor 184 disposed with a different disposition. For example, the first inductor 182 and the second inductor 184 may occupy an area corresponding to a portion of the area occupied by the first inductor 182 and the second inductor 184 being disposed side-by-side.

Figure 7:
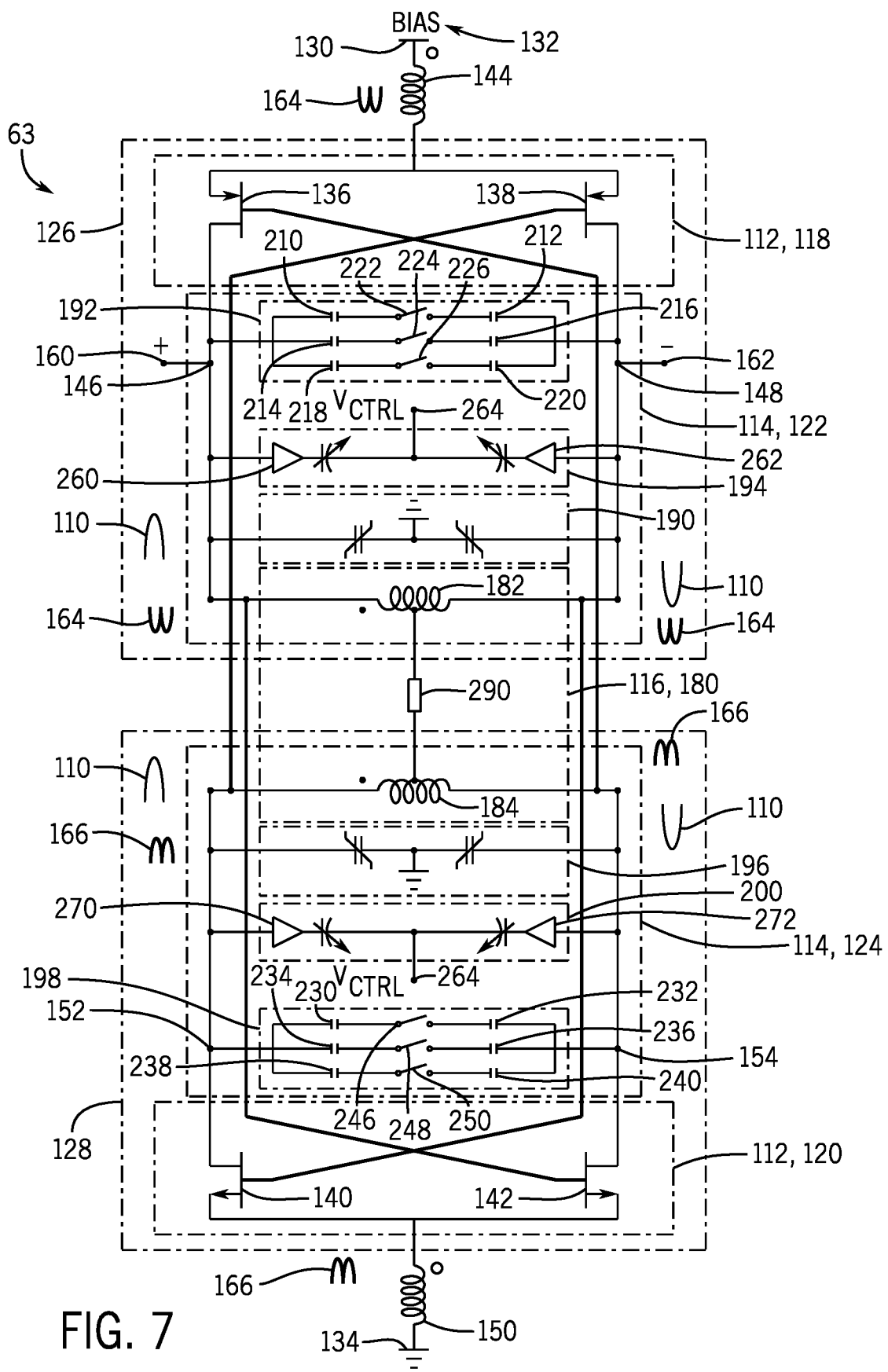
FIG. 7 is a schematic diagram of the VCO of FIG. 5 where the common-mode isolation circuitry includes the transformer and a first impedance component, according to embodiments of the present disclosure.

FIG. 7 is a schematic diagram of the VCO 63 where the common-mode isolation circuitry 116 includes the transformer 180 and a first impedance component 290, according to embodiments of the present disclosure. The first impedance component 290 may be coupled to (e.g., tapped onto) the first inductor 182 and the second inductor 184. In some embodiments, the first impedance component 290 may be coupled to (e.g., symmetrically tapped onto) a middle of the first inductor 182 (e.g., splitting the first inductor 182 in half at the tap point) and a middle of the second inductor 184 (e.g., splitting the second inductor 184 in half at the tap point). In different embodiments, the first impedance component 290 may include one or more programmable or non-programmable resistors, capacitors, inductors, or a combination thereof. For example, the first impedance component 290 may include a common-mode degeneration inductor. In different embodiments, the first impedance component 290 may have different dimensions corresponding to the resonant frequency range.

In some embodiments, the VCO 63 may include the first LC tank circuit 122 including the first inductor 182, the first capacitor bank 190, the first switched capacitor circuit 192, and the first varactor 194. Furthermore, the VCO 63 may include the second LC tank circuit 124 including the second inductor 184, the second capacitor bank 196, the second switched capacitor circuit 198, and the second varactor 200. However, it should be appreciated that in different embodiments, the first LC tank circuit 122 and the second LC tank circuit 124 may include different circuit components. For example, the first LC tank circuit 122 and the second LC tank circuit 124 may include a different number of capacitors and/or inductors to generate the output signal 110.

As discussed above, the inductive coupling between the first cell 126 and the second cell 128 via the common-mode isolation circuitry 116 and/or the gate voltage interdependency of the switches 136, 138, 140, and 142 of the first cell 126 and the second cell 128 may reduce the undesired voltage and/or the frequency offsets of the output signal 110 based on the first CM noise 164 and/or the second CM noise 166. Accordingly, the VCO 63 may have improved SNR for generating the output signal 110 without increased power consumption. Moreover, the first inductor 182 and the second inductor may occupy a reduced area when overlaid on or under each other compared to an area occupied by the first inductor 182 and the second inductor 184 being disposed with a different disposition (e.g., side-by-side).

Moreover, the first inductor 182 and the second inductor 184 may inductively couple with a coupling factor (K) equal to or above the first threshold for signals having an oscillation frequency within the resonant frequency range. The first inductor 182 and the second inductor 184 may inductively uncouple for signals having an oscillation frequency outside the resonant frequency range based on a coupling factor equal to or below a second threshold.

The first impedance component 290 may conduct the DC signal (e.g., the electrical currents) between the first cell 126 and the second cell 128. Accordingly, the NMOS circuit 118 and the PMOS circuit 120 may generate the DC signal based on the bias voltage 132 (or any other viable input signal) and based on the first impedance component 290 coupling the first inductor 182 and the second inductor 184.

The first impedance component 290 may adjust a common-mode impedance between the first cell 126 and the second cell 128. The common-mode impedance may correspond to a phase shift of the first CM noise 164, the second CM noise 166, or both. As such, the common-mode isolation circuitry 116 may include the first impedance component 290 to adjust a phase of the first CM noise 164, adjust a phase of the second CM noise 166, or both. Accordingly, the common-mode impedance may correspond to the phase shift (e.g., a phase relationship) between the first CM noise 164 and the second CM noise 166.

In turn, the phase shift of the first CM noise 164 and the second CM noise 166 may correspond to reducing the undesired voltage and/or the frequency offsets of the output signal 110. For example, the phase shift may adjust the phase of the first CM noise 164 and the second CM noise 166 to be out of phase (e.g., inverted, nearly inverted). As such, the gate terminals of the switches 136 and 138 of the first cell 126 may receive the second CM noise 166 out of phase (e.g., inverted, nearly inverted) compared to the first CM noise 164. The switches 136 and 138 of the first cell 126 may reduce the undesired voltage and/or the frequency offsets of the output signal 110 caused by the first CM noise 164. Similarly, the gate terminals of the switches 140 and 142 of the second cell 128 may receive the first CM noise 164 out of phase (e.g., inverted, nearly inverted) compared to the second CM noise 166. Accordingly, the switches 140 and 142 of the second cell 128 may reduce the undesired voltage and/or the frequency offsets of the output signal 110 caused by the second CM noise 166.

In specific embodiments, the first impedance component 290 may include a number of programmable resistors, capacitors, inductors, or a combination thereof. In such embodiments, the first impedance component 290 may adjust the common-mode impedance between the first cell 126 and the second cell 128 based on receiving control signals. For example, the processor 12 of the electronic device 10 discussed above, a controller, and/or any other viable component may generate and/or provide the control signals to the first impedance component 290 to adjust the common-mode impedance between the first cell 126 and the second cell 128. In some cases, the phase shift (e.g., the phase relationship) between the first CM noise 164 and the second CM noise 166 may be adjusted dynamically.

Alternative or additionally, the first impedance component 290 may have an impedance value corresponding to uncoupling the signals having an oscillation frequency outside the resonant frequency range. In any case, the first impedance component 290 may reduce an amplitude of noise and/or leakage of the first cell 126 (e.g., the first CM noise 164) at the second cell 128 and/or reduce an amplitude of noise and/or leakage of the second cell 128 (e.g., the second CM noise 166) at the first cell 126. Accordingly, the VCO 63 may generate the output signal 110 having the desired oscillation frequency within the resonant frequency range with reduced phase noise and improved SNR based on including the first impedance component 290.

Figure 8:
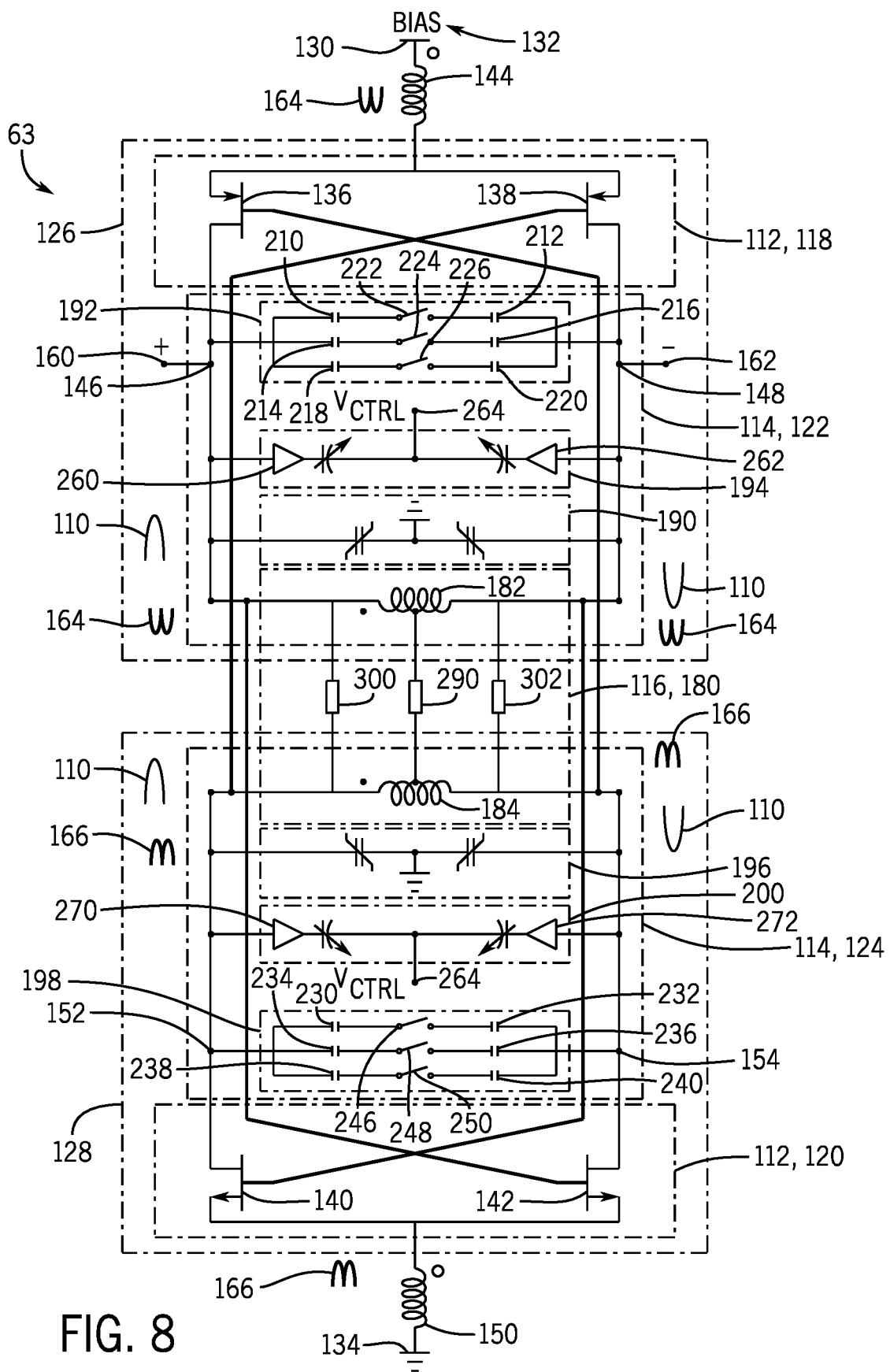
FIG. 8 is a schematic diagram of the VCO of FIG. 5 where the common-mode isolation circuitry includes the transformer, the first impedance component, a second impedance component, and a third impedance component, according to embodiments of the present disclosure.

FIG. 8 is a schematic diagram of the VCO 63 where the common-mode isolation circuitry 116 includes the transformer 180, the first impedance component 290, a second impedance component 300, and a third impedance component 302, according to embodiments of the present disclosure. In the depicted embodiment, the first impedance component 290 may be coupled to (e.g., tapped onto) the first inductor 182 and the second inductor 184. In some embodiments, the first impedance component 290 may be coupled to (e.g., symmetrically tapped onto) a middle of the first inductor 182 and a middle of the second inductor 184. The second impedance component 300 may be coupled to the drain terminal of the first switch 136 via the first node 146 and coupled to the drain terminal of the third switch 140 via the third node 152. The third impedance component 302 may be coupled to the drain terminal of the second switch 138 via the second node 148 and coupled to the drain terminal of the fourth switch 142 via the fourth node 154.

In different embodiments, the first impedance component 290, the second impedance component 300, and/or the third impedance component 302 may each include one or more programmable or non-programmable resistors, capacitors, inductors, or a combination thereof. For example, the first impedance component 290, the second impedance component 300, and/or the third impedance component 302 may each include a common-mode degeneration inductor.

In some embodiments, the VCO 63 may include the first LC tank circuit 122 including the first inductor 182, the first capacitor bank 190, the first switched capacitor circuit 192, and the first varactor 194. Furthermore, the VCO 63 may include the second LC tank circuit 124 including the second inductor 184, the second capacitor bank 196, the second switched capacitor circuit 198, and the second varactor 200. However, it should be appreciated that in different embodiments, the first LC tank circuit 122 and the second LC tank circuit 124 may include different circuit components. For example, the first LC tank circuit 122 and the second LC tank circuit 124 may include a different number of capacitors and/or inductors to generate the output signal 110.

As discussed above, the inductive coupling between the first cell 126 and the second cell 128 via the common-mode isolation circuitry 116 and/or the gate voltage interdependency of the switches 136, 138, 140, and 142 of the first cell 126 and the second cell 128 may reduce the undesired voltage and/or the frequency offsets of the output signal 110 based on the first CM noise 164 and/or the second CM noise 166. Accordingly, the VCO 63 may have improved SNR for generating the output signal 110 without increased power consumption. Moreover, the first inductor 182 and the second inductor may occupy a reduced area when overlaid on or under each other compared to an area occupied by the first inductor 182 and the second inductor 184 being disposed with a different disposition (e.g., side-by-side).

Moreover, the first inductor 182 and the second inductor 184 may inductively couple with a coupling factor (K) equal to or above the first threshold for signals having an oscillation frequency within the resonant frequency range. The first inductor 182 and the second inductor 184 may inductively uncouple for signals having an oscillation frequency outside the resonant frequency range based on a coupling factor equal to or below a second threshold.

The first impedance component 290 may conduct the DC signal (e.g., the electrical currents) between the first cell 126 and the second cell 128. Accordingly, the NMOS circuit 118 and the PMOS circuit 120 may generate the DC signal based on the bias voltage 132 (or any other viable input signal) and based on the first impedance component 290, the second impedance component 300, and/or the third impedance component 302 coupling the first inductor 182 and the second inductor 184.

The first impedance component 290, the second impedance component 300, and the third impedance component 302 may adjust the common-mode impedance between the first cell 126 and the second cell 128. As mentioned above, the common-mode impedance may correspond to the phase shift of the first CM noise 164, the second CM noise 166, or both. As such, the common-mode isolation circuitry 116 may include the first impedance component 290, the second impedance component 300, and the third impedance component 302 to adjust the phase of the first CM noise 164, adjust the phase of the second CM noise 166, or both. Accordingly, the common-mode impedance may correspond to the phase shift (e.g., a phase relationship) between the first CM noise 164 and the second CM noise 166.

In turn, the phase shift of the first CM noise 164 and the second CM noise 166 may correspond to reducing the undesired voltage and/or the frequency offsets of the output signal 110. For example, the phase shift may adjust the phase of the first CM noise 164 and the second CM noise 166 to be out of phase (e.g., inverted, nearly inverted). As such, the gate terminals of the switches 136 and 138 of the first cell 126 may receive the second CM noise 166 out of phase (e.g., inverted, nearly inverted) compared to the first CM noise 164. The switches 136 and 138 of the first cell 126 may reduce the undesired voltage and/or the frequency offsets of the output signal 110 caused by the first CM noise 164. Similarly, the gate terminals of the switches 140 and 142 of the second cell 128 may receive the first CM noise 164 out of phase (e.g., inverted, nearly inverted) compared to the second CM noise 166. Accordingly, the switches 140 and 142 of the second cell 128 may reduce the undesired voltage and/or the frequency offsets of the output signal 110 caused by the second CM noise 166.

In specific embodiments, the first impedance component 290, the second impedance component 300, and/or the third impedance component 302 may each include a number of programmable resistors, capacitors, inductors, or a combination thereof. In such embodiments, the first impedance component 290, the second impedance component 300, and the third impedance component 302 may adjust the common-mode impedance between the first cell 126 and the second cell 128 based on receiving control signals. For example, the processor 12 of the electronic device 10 discussed above, a controller, and/or any other viable component may generate and/or provide the control signals to the first impedance component 290 to adjust the common-mode impedance between the first cell 126 and the second cell 128. In some cases, the phase shift (e.g., the phase relationship) between the first CM noise 164 and the second CM noise 166 may be adjusted dynamically.

Alternative or additionally, the first impedance component 290 may have an impedance value corresponding to uncoupling the signals having an oscillation frequency outside the resonant frequency range. In any case, the first impedance component 290 may reduce an amplitude of noise and/or leakage of the first cell 126 (e.g., the first CM noise 164) at the second cell 128 and/or reduce an amplitude of noise and/or leakage of the second cell 128 (e.g., the second CM noise 166) at the first cell 126. Accordingly, the VCO 63 may generate the output signal 110 having the desired oscillation frequency within the resonant frequency range with reduced phase noise and improved SNR based on including the first impedance component 290.

Figure 9:
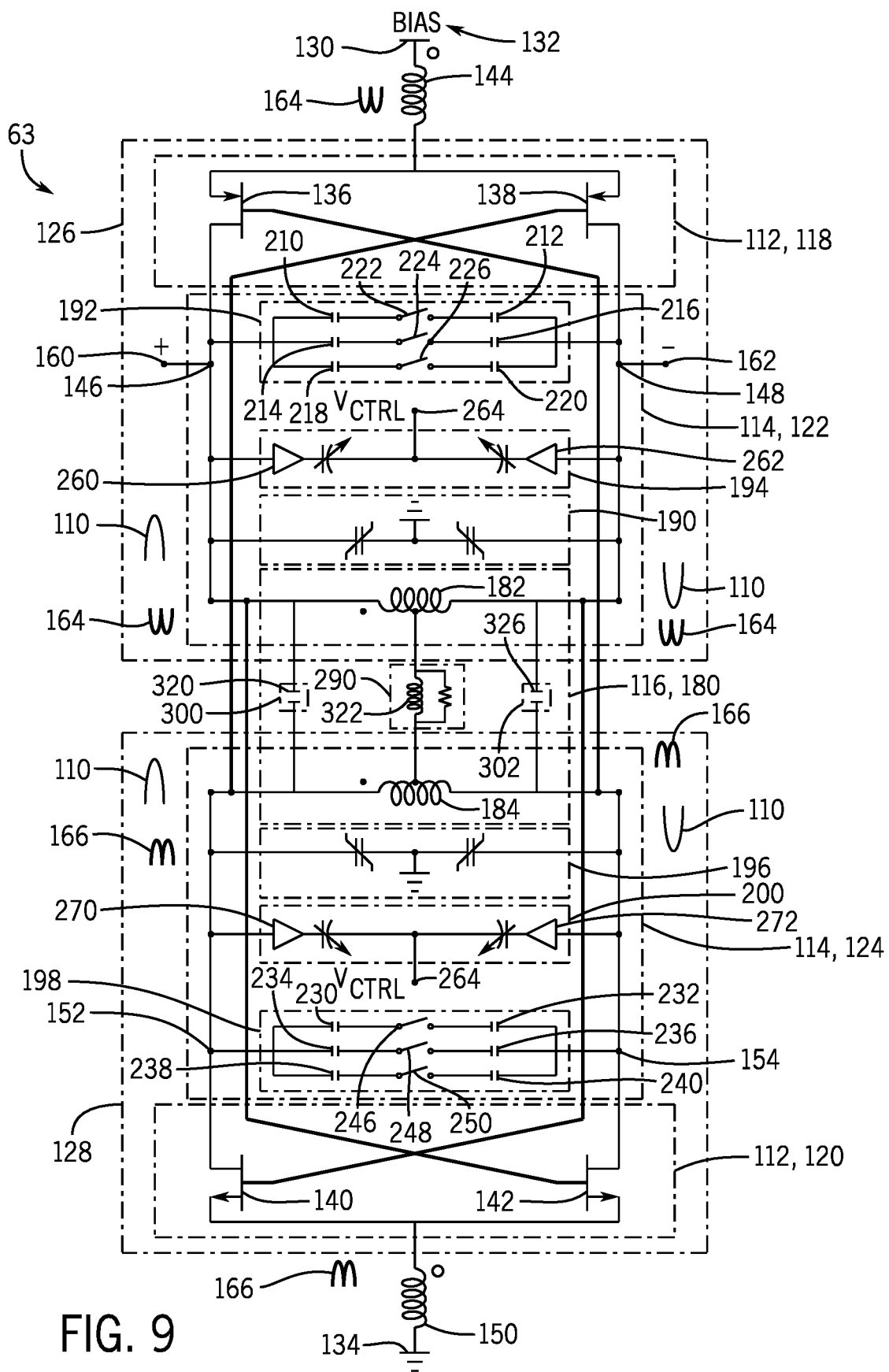
FIG. 9 is a schematic diagram of the VCO of FIG. 5 where the common-mode isolation circuitry includes the transformer, a first phase control capacitor, a common-mode degeneration inductor, a resistor, and a second phase control capacitor, according to embodiments of the present disclosure.

FIG. 9 is a schematic diagram of the VCO 63 where the common-mode isolation circuitry 116 includes the transformer 180, a first phase control capacitor 320, a common-mode degeneration inductor 322, a resistor 324, and a second phase control capacitor 326, according to embodiments of the present disclosure. In some embodiments, the VCO 63 may include the first impedance component 290, the second impedance component 300, and/or the third impedance component 302 of FIG. 9 discussed above. In such embodiments, the first impedance component 290 may include the common-mode degeneration inductor 322 and the resistor 324. The common-mode degeneration inductor 322 and resistor 324 may be coupled in parallel. The second impedance component 300 may include the first phase control capacitor 320. The third impedance component 302 may include the second phase control capacitor 326.

In the depicted embodiment, the common-mode degeneration inductor 322 and the resistor 324 may be coupled to (e.g., tapped onto) the first inductor 182 and the second inductor 184. In some embodiments, the common-mode degeneration inductor 322 and the resistor 324 may be coupled to (e.g., symmetrically tapped onto) a middle of the first inductor 182 and a middle of the second inductor 184. The first phase control capacitor 320 may be coupled to the drain terminal of the first switch 136 via the first node 146 and coupled to the drain terminal of the third switch 140 via the third node 152. The second phase control capacitor 326 may be coupled to the drain terminal of the second switch 138 via the second node 148 and coupled to the drain terminal of the fourth switch 142 via the fourth node 154.

In some embodiments, the VCO 63 may include the first LC tank circuit 122 including the first inductor 182, the first capacitor bank 190, the first switched capacitor circuit 192, and the first varactor 194. Furthermore, the VCO 63 may include the second LC tank circuit 124 including the second inductor 184, the second capacitor bank 196, the second switched capacitor circuit 198, and the second varactor 200. However, it should be appreciated that in different embodiments, the first LC tank circuit 122 and the second LC tank circuit 124 may include different circuit components. For example, the first LC tank circuit 122 and the second LC tank circuit 124 may include a different number of capacitors and/or inductors to generate the output signal 110.

As discussed above, the inductive coupling between the first cell 126 and the second cell 128 via the common-mode isolation circuitry 116 and/or the gate voltage interdependency of the switches 136, 138, 140, and 142 of the first cell 126 and the second cell 128 may reduce the undesired voltage and/or the frequency offsets of the output signal 110 based on the first CM noise 164 and/or the second CM noise 166. Accordingly, the VCO 63 may have improved SNR for generating the output signal 110 without increased power consumption. Moreover, the first inductor 182 and the second inductor may occupy a reduced area when overlaid on or under each other compared to an area occupied by the first inductor 182 and the second inductor 184 being disposed with a different disposition (e.g., side-by-side).

Moreover, the first inductor 182 and the second inductor 184 may inductively couple with a coupling factor (K) equal to or above the first threshold for signals having an oscillation frequency within the resonant frequency range. The first inductor 182 and the second inductor 184 may inductively uncouple for signals having an oscillation frequency outside the resonant frequency range based on a coupling factor equal to or below a second threshold.

The common-mode degeneration inductor 322, the resistor 324, the first phase control capacitor 320, and/or the second phase control capacitor 326 may conduct the DC signal (e.g., the electrical currents) between the first cell 126 and the second cell 128. Accordingly, the NMOS circuit 118 and the PMOS circuit 120 may generate the DC signal based on the bias voltage 132 (or any other viable input signal) and based on the common-mode degeneration inductor 322, the resistor 324, the first phase control capacitor 320, and/or the second phase control capacitor 326 coupling the first inductor 182 and the second inductor 184.

The common-mode degeneration inductor 322, the resistor 324, the first phase control capacitor 320, and the second phase control capacitor 326 may adjust the common-mode impedance between the first cell 126 and the second cell 128. As mentioned above, the common-mode impedance may correspond to the phase shift of the first CM noise 164, the second CM noise 166, or both. As such, the common-mode isolation circuitry 116 may include the common-mode degeneration inductor 322, the resistor 324, the first phase control capacitor 320, and the second phase control capacitor 326 to adjust the phase of the first CM noise 164, the phase of the second CM noise 166, or both. Accordingly, the common-mode impedance may correspond to the phase shift (e.g., a phase relationship) between the first CM noise 164 and the second CM noise 166.

In turn, the phase shift of the first CM noise 164 and the second CM noise 166 may correspond to reducing the undesired voltage and/or the frequency offsets of the output signal 110. For example, the phase shift may adjust the phase of the first CM noise 164 and the second CM noise 166 to be out of phase (e.g., inverted, nearly inverted). As such, the gate terminals of the switches 136 and 138 of the first cell 126 may receive the second CM noise 166 out of phase (e.g., inverted, nearly inverted) compared to the first CM noise 164. The switches 136 and 138 of the first cell 126 may reduce the undesired voltage and/or the frequency offsets of the output signal 110 caused by the first CM noise 164. Similarly, the gate terminals of the switches 140 and 142 of the second cell 128 may receive the first CM noise 164 out of phase (e.g., inverted, nearly inverted) compared to the second CM noise 166. Accordingly, the switches 140 and 142 of the second cell 128 may reduce the undesired voltage and/or the frequency offsets of the output signal 110 caused by the second CM noise 166.

In specific embodiments, the common-mode degeneration inductor 322, the resistor 324, the first phase control capacitor 320, and/or the second phase control capacitor 326 may each include a number of programmable resistors, capacitors, inductors, or a combination thereof. In such embodiments, the common-mode degeneration inductor 322, the resistor 324, the first phase control capacitor 320, and the second phase control capacitor 326 may adjust the common-mode impedance between the first cell 126 and the second cell 128 based on receiving control signals. For example, the processor 12 of the electronic device 10 discussed above, a controller, and/or any other viable component may generate and/or provide the control signals to the common-mode degeneration inductor 322 and the resistor 324 to adjust the common-mode impedance between the first cell 126 and the second cell 128. In some cases, the phase shift (e.g., the phase relationship) between the first CM noise 164 and the second CM noise 166 may be adjusted dynamically.

Alternative or additionally, the common-mode degeneration inductor 322, the resistor 324, the first phase control capacitor 320, and the second phase control capacitor 326 may have an impedance value corresponding to uncoupling the signals having an oscillation frequency outside the resonant frequency range. In any case, the common-mode degeneration inductor 322, the resistor 324, the first phase control capacitor 320, and the second phase control capacitor 326 may reduce an amplitude of noise and/or leakage of the first cell 126 (e.g., the first CM noise 164) at the second cell 128 and/or reduce an amplitude of noise and/or leakage of the second cell 128 (e.g., the second CM noise 166) at the first cell 126. Accordingly, the VCO 63 may generate the output signal 110 having the desired oscillation frequency within the resonant frequency range with reduced phase noise and improved SNR based on including the common-mode degeneration inductor 322, the resistor 324, the first phase control capacitor 320, and the second phase control capacitor 326.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform] ing [a function] . . . " or "step for [perform] ing [a function] . . . ," it is intended that such elements are to be interpreted under 35 U.S.C. 112 (f). However, for any claims containing elements designated in any other manner, it is intended that such elements are not to be interpreted under 35 U.S.C. 112 (f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

An electronic device may include an antenna and a voltage-controlled oscillator (VCO) coupled to the antenna. The VCO may include a first switch, a second switch, a first inductor-capacitor tank circuit coupled to a first drain terminal of the first switch and a second drain terminal of the second switch, a third switch, a third gate terminal of the third switch being coupled to the second drain terminal, a second gate terminal of the second switch being coupled to a third drain terminal of the third switch, a fourth switch, a fourth gate terminal of the fourth switch being coupled to the first drain terminal, a first gate terminal of the first switch being coupled to a fourth drain terminal of the fourth switch, and a second inductor-capacitor tank circuit coupled to the third drain terminal and the fourth drain terminal.

Wherein the first inductor-capacitor tank circuit may include a first capacitor bank, a first switched capacitor circuit, a first varactor, or any combination thereof, and the second inductor-capacitor tank circuit may include a second capacitor bank, a second switched capacitor circuit, a second varactor, or any combination thereof.

The electronic device may include a processor coupled to the VCO, the processor may output control signals to one or more switches of the first switched capacitor circuit and the second switched capacitor circuit, a control voltage to one or more junction diode of the first varactor and the second varactor, or both.

Wherein the first inductor-capacitor tank circuit may include a first capacitor and a first inductor having a first resonant frequency within a resonant frequency range, the second inductor-capacitor tank circuit may include a second capacitor and a second inductor having a second resonant frequency within the resonant frequency range, the first inductor and the second inductor may inductively couple based on signals having a desired oscillation frequency within the resonant frequency range, the first inductor and the second inductor may inductively uncouple based on signals having an undesired oscillation frequency outside the resonant frequency range.

The electronic device may include a receiver including the VCO.

Wherein a first source terminal of the first switch and a second source terminal of the second switch may receive a signal from the antenna, the VCO may output an output signal indicative of a frequency and phase of the signal.

The electronic device may include a transmitter including the VCO.

Wherein the VCO may generate an output signal corresponding to a carrier signal to modulate a transmission signal for transmission by the antenna.

A transceiver may include amplification circuitry and voltage-controlled oscillator (VCO) coupled to the amplification circuitry. The VCO may include a first switch may output a first voltage, a second switch may output a second voltage, a third switch may output a third voltage, a fourth switch may output a fourth voltage, a first inductor-capacitor tank circuit coupled to the first switch and the second switch, the first inductor-capacitor tank circuit may receive a direct current (DC) signal based on the first switch receiving the fourth voltage and the second switch receiving the third voltage, and a second inductor-capacitor tank circuit coupled to the third switch and the fourth switch, the second inductor-capacitor tank circuit may receive the DC signal based on the third switch receiving the second voltage and the fourth switch receiving the first voltage.

Wherein the first switch, the second switch, the third switch, and the fourth switch are may generate the DC signal based on the first switch receiving the fourth voltage, the second switch receiving the third voltage, the third switch receiving the second voltage, and the fourth switch receiving the first voltage.

Wherein the amplification circuitry may include a low noise amplifier, the low noise amplifier may generate an amplified signal, the VCO may generate an output signal based on the amplified signal, or the amplification circuitry may include a power amplifier, the power amplifier may amplify the output signal.

Wherein the first inductor-capacitor tank circuit may include a first inductor and the second inductor-capacitor tank circuit may include a second inductor, the first inductor and the second inductor may inductively couple based on the DC signal, and the VCO may generate an output signal having a desired oscillation frequency within a resonant frequency range based on the first inductor inductively coupling to the second inductor.

Wherein the first inductor-capacitor tank circuit and the second inductor-capacitor tank circuit have a capacitance value and an inductance value corresponding to a resonant frequency within the resonant frequency range.

A voltage-controlled oscillator (VCO) may include a first switch, a second switch, a first inductor-capacitor tank circuit coupled to a first drain terminal of the first switch and a second drain terminal of the second switch, a third switch, a third gate terminal of the third switch being coupled to the second drain terminal, a second gate terminal of the second switch being coupled to a third drain terminal of the third switch, a fourth switch, a fourth gate terminal of the fourth switch being coupled to the first drain terminal, a first gate terminal of the first switch being coupled to a fourth drain terminal of the fourth switch, and a second inductor-capacitor tank circuit coupled to the third drain terminal and the fourth drain terminal.

Wherein a capacitance value of the first inductor-capacitor tank circuit corresponds to a capacitance value of the second inductor-capacitor tank circuit, and an inductance value of the first inductor-capacitor tank circuit corresponds to an inductance value of the second inductor-capacitor tank circuit.

Wherein the first inductor-capacitor tank circuit may include a first capacitor and a first inductor having a first resonant frequency within a resonant frequency range and the second inductor-capacitor tank circuit may include a second capacitor and a second inductor having a second resonant frequency within the resonant frequency range.

Wherein the first inductor and the second inductor may inductively couple based on signals having a desired oscillation frequency within the resonant frequency range.

Wherein the first inductor and the second inductor may inductively uncouple based on signals having an undesired oscillation frequency outside the resonant frequency range.

Wherein a first source terminal of the first switch and a second source terminal of the second switch may couple to a voltage source, and a third source terminal of the third switch and a fourth source terminal of the fourth switch may couple to a ground terminal.

Wherein the first inductor-capacitor tank circuit, the second inductor-capacitor tank circuit, or both may output an output signal based on a bias voltage.

The invention claimed is:
1. An electronic device comprising:
an antenna; and
a voltage-controlled oscillator (VCO) coupled to the antenna, the VCO comprising
a first switch,
a second switch comprising a second gate terminal and a second drain terminal,
a first inductor-capacitor tank circuit coupled to the first switch and the second switch,
a second inductor-capacitor tank circuit coupled to the first inductor-capacitor tank circuit,
a third switch comprising a third gate terminal and a third drain terminal, the third drain terminal coupled to the second inductor-capacitor tank circuit and directly coupled to the second gate terminal, and the third gate terminal directly coupled to the second drain terminal, and
a fourth switch coupled to the second inductor-capacitor tank circuit and the first switch.

2. The electronic device of claim 1, wherein a fourth gate terminal of the fourth switch is coupled to a first drain terminal of the first switch.

3. The electronic device of claim 1, wherein a first gate terminal of the first switch is coupled to a fourth drain terminal of the fourth switch.

4. The electronic device of claim 1, wherein the second inductor-capacitor tank circuit is coupled to the first inductor-capacitor tank circuit via a first impedance component, the first impedance component comprising a common-mode degeneration inductor, a resistor, or a capacitor.

5. The electronic device of claim 1, wherein the second inductor-capacitor tank circuit is coupled to the first inductor-capacitor tank circuit via a first impedance component, a second impedance component, and a third impedance component.

6. The electronic device of claim 5, wherein each of the first impedance component, the second impedance component, and the third impedance component comprise an inductor, a resistor, a capacitor, or any combination thereof.

7. The electronic device of claim 5, wherein the first impedance component is coupled to a first inductor of the first inductor-capacitor tank circuit and a second inductor of the second inductor-capacitor tank circuit, the second impedance component is coupled to a first drain terminal of the first switch and the third drain terminal of the third switch, and the third impedance component is coupled to the second drain terminal of the second switch and a fourth drain terminal of the fourth switch, the first inductor being coupled to the first drain terminal and the second drain terminal, and the second inductor being coupled to the third drain terminal and the fourth drain terminal.

8. The electronic device of claim 1, comprising
a receiver comprising the VCO, a first source terminal of the first switch and a second source terminal of the second switch being configured to receive a received signal from the antenna, and the VCO being configured to output an output signal indicative of a frequency and phase of the received signal, or
a transmitter comprising the VCO, the VCO being configured to generate an output signal corresponding to a carrier signal to modulate a transmission signal for transmission by the antenna.

9. A transceiver comprising:
amplification circuitry; and
voltage-controlled oscillator (VCO) coupled to the amplification circuitry, the VCO comprising:
a first switch;
a second switch comprising a second gate terminal and a second drain terminal;
a third switch comprising a third gate terminal and a third drain terminal, the third drain terminal directly coupled to the second gate terminal, and the third gate terminal directly coupled to the second drain terminal;
a fourth switch;
a first inductor-capacitor tank circuit coupled to the first switch and the second switch; and
a second inductor-capacitor tank circuit coupled to third switch, the fourth switch, and the first inductor-capacitor tank circuit.

10. The transceiver of claim 9, wherein the second inductor-capacitor tank circuit is configured to inductively couple to the first inductor-capacitor tank circuit based on signals having a desired oscillation frequency within a resonant frequency range, and inductively uncouple from the first inductor-capacitor tank circuit based on signals having an undesired oscillation frequency outside the resonant frequency range.

11. The transceiver of claim 9, wherein the VCO comprises a first impedance component coupled to the first inductor-capacitor tank circuit and the second inductor-capacitor tank circuit, the first impedance component having an impedance value, a capacitance value, a resistance value or any combination thereof associated with shifting a phase of a first common-mode signal of the first switch, the second switch, and the first inductor-capacitor tank circuit, a second common-mode signal of the third switch, the fourth switch, and the second inductor-capacitor tank circuit, or both.

12. The transceiver of claim 9, wherein the VCO comprises a first impedance component, a second impedance component, and a third impedance component coupled to the first inductor-capacitor tank circuit and the second inductor-capacitor tank circuit, the first impedance component, the second impedance component, and the third impedance component having an impedance value, a capacitance value, a resistance value or any combination thereof associated with shifting a phase of a first common-mode signal of the first switch, the second switch, and the first inductor-capacitor tank circuit, a second common-mode signal of the third switch, the fourth switch, and the second inductor-capacitor tank circuit, or both.

13. The transceiver of claim 9, wherein
the amplification circuitry comprises a low noise amplifier, the low noise amplifier configured to generate an amplified signal, the VCO configured to generate an output signal based on the amplified signal, or
the amplification circuitry comprises a power amplifier, the power amplifier configured to amplify the output signal.

14. The transceiver of claim 9, wherein a first drain terminal of the first switch is coupled to a fourth gate terminal of the fourth switch, and a first gate terminal of the first switch is coupled to a fourth drain terminal of the fourth switch.

15. A voltage-controlled oscillator (VCO) comprising
a first switch,
a second switch comprising a second gate terminal and a second drain terminal,
a first inductor-capacitor tank circuit coupled to the first switch and the second switch, a second inductor-capacitor tank circuit coupled to the first inductor-capacitor tank circuit, a third switch comprising a third gate terminal and a third drain terminal, the third drain terminal coupled to the second inductor-capacitor tank circuit and directly coupled to the second gate terminal, and the third gate terminal directly coupled to the second drain terminal, and a fourth switch coupled to the second inductor-capacitor tank circuit and the first switch.

16. The VCO of claim 15, wherein
a fourth gate terminal of the fourth switch is coupled to a first drain terminal of the first switch, and
a first gate terminal of the first switch is coupled to a fourth drain terminal of the fourth switch.

17. The VCO of claim 15, wherein the first inductor-capacitor tank circuit comprises a first inductor coupled to a first drain terminal of the first switch and the second drain terminal of the second switch, and the second inductor-capacitor tank circuit comprises a second inductor coupled to the third drain terminal of the third switch and a fourth drain of the fourth switch, the first inductor and the second inductor being configured to inductively couple based on signals having a desired oscillation frequency within a resonant frequency range and inductively uncouple based on signals having an undesired oscillation frequency outside the resonant frequency range.

18. The VCO of claim 17, comprising common-mode isolation circuitry comprising the first inductor, the second inductor, and a first impedance component coupled to the first inductor and the second inductor.

19. The VCO of claim 18, wherein the common-mode isolation circuitry comprises
a second impedance component coupled to the first drain terminal of the first switch and the third drain terminal of the third switch, and
a third impedance component coupled to the second drain terminal of the second switch and a fourth drain terminal of the fourth switch.

20. The VCO of claim 15, wherein a first drain terminal of the first switch and the second drain terminal of the second switch are coupled to the first inductor-capacitor tank circuit, and the third drain terminal of the third switch and a fourth drain terminal of the fourth switch are coupled to the second inductor-capacitor tank circuit.

* * * * *